United States Patent
Sung et al.

(10) Patent No.: US 9,735,060 B1
(45) Date of Patent: Aug. 15, 2017

(54) HYBRID FIN CUT ETCHING PROCESSES FOR PRODUCTS COMPRISING TAPERED AND NON-TAPERED FINFET SEMICONDUCTOR DEVICES

(71) Applicant: GLOBALFOUNDRIES Inc., Grand Cayman (KY)

(72) Inventors: Min Gyu Sung, Latham, NY (US); Ruilong Xie, Niskayuna, NY (US); Chanro Park, Clifton Park, NY (US); Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/006,304

(22) Filed: Jan. 26, 2016

(51) Int. Cl.
*H01L 21/302* (2006.01)
*H01L 21/8234* (2006.01)
*H01L 21/308* (2006.01)

(52) U.S. Cl.
CPC .. *H01L 21/823431* (2013.01); *H01L 21/3083* (2013.01)

(58) Field of Classification Search
CPC .......... H01L 21/30604; H01L 21/3085; H01L 21/311; H01L 21/31111; H01L 21/31053; H01L 27/1207; H01L 27/1116; H01L 21/31144
USPC ........ 438/283, 427, 714, 717, 719, 723, 736
See application file for complete search history.

(56) References Cited

U.S. PATENT DOCUMENTS

| | | | |
|---|---|---|---|
| 9,379,244 B2 * | 6/2016 | Hur | H01L 21/02532 |
| 2015/0021690 A1 * | 1/2015 | Jacob | H01L 21/02532 257/347 |
| 2015/0255457 A1 * | 9/2015 | Loubet | H01L 27/0886 257/77 |
| 2016/0268378 A1 * | 9/2016 | Hashemi | H01L 29/1054 |

* cited by examiner

*Primary Examiner* — Lan Vinh
(74) *Attorney, Agent, or Firm* — Amerson Law Firm, PLLC

(57) ABSTRACT

For an integrated circuit product comprising a non-tapered FinFET device formed in a first region of the substrate and a tapered FinFET device in a second region of the substrate, the method includes, among other things, forming the fins for the non-tapered FinFET device in the first region by performing a fin-cut-last process and forming the fins for the tapered FinFET by performing a fin-cut-first process.

20 Claims, 33 Drawing Sheets

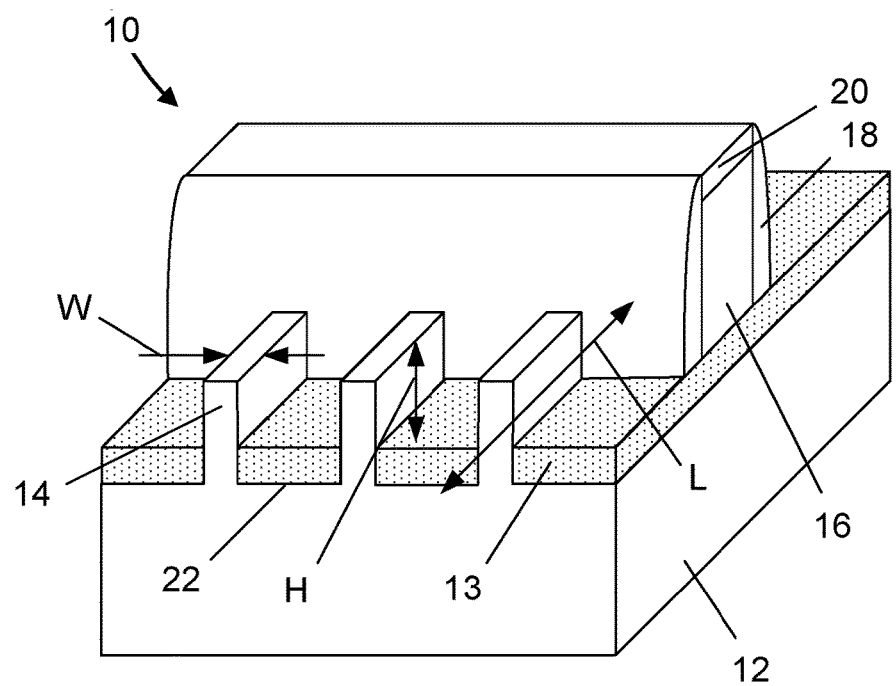
Figure 1A (Prior Art)
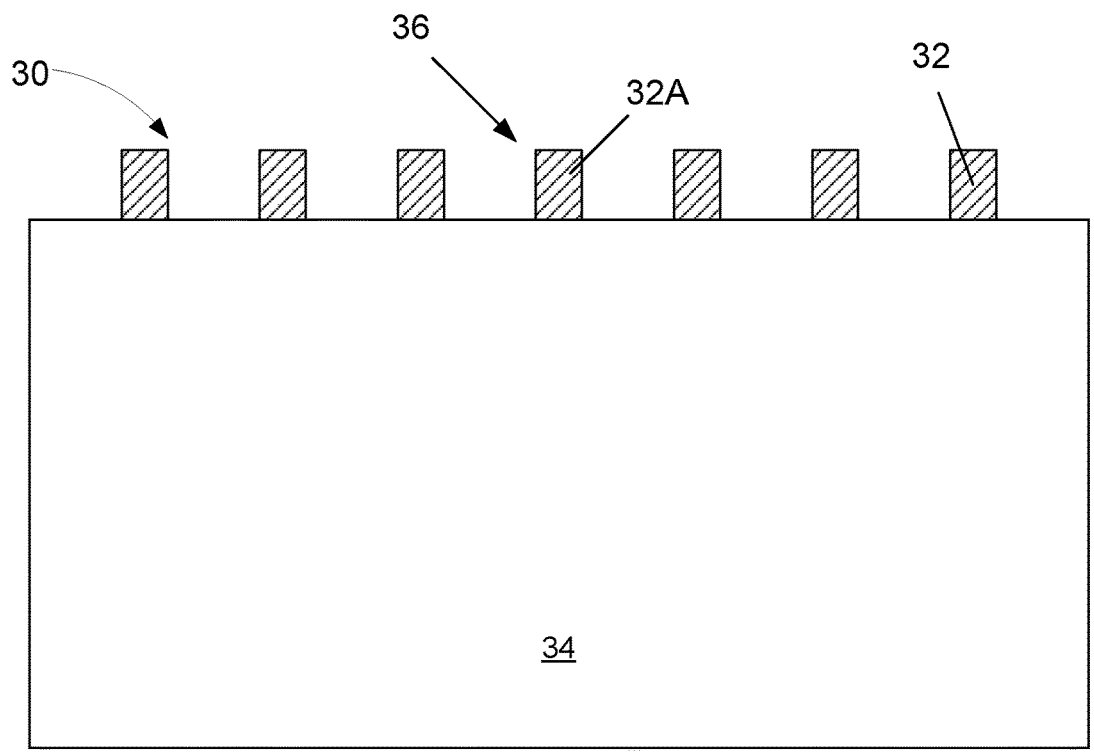
(Prior Art) Figure 1B

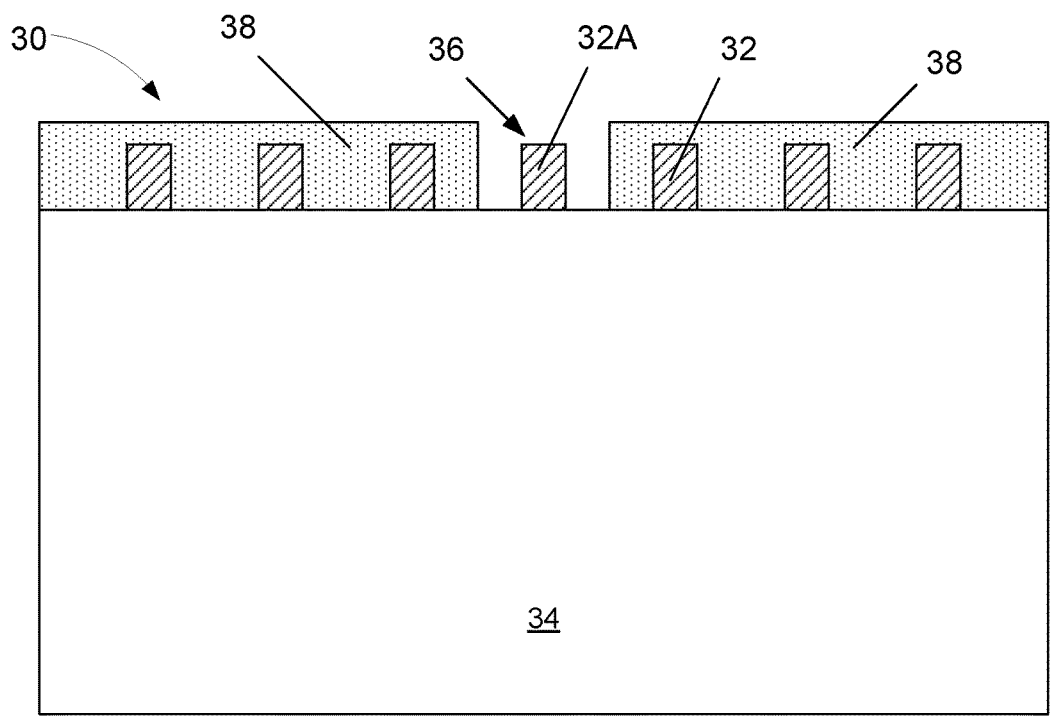
(Prior Art) Figure 1C
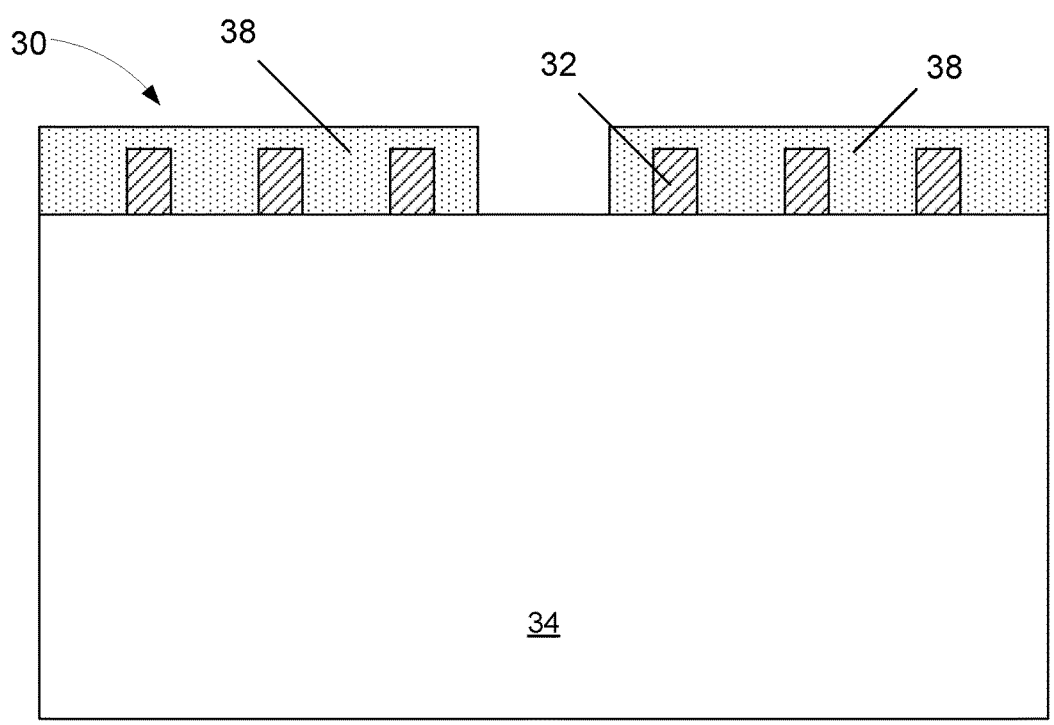
(Prior Art) Figure 1D

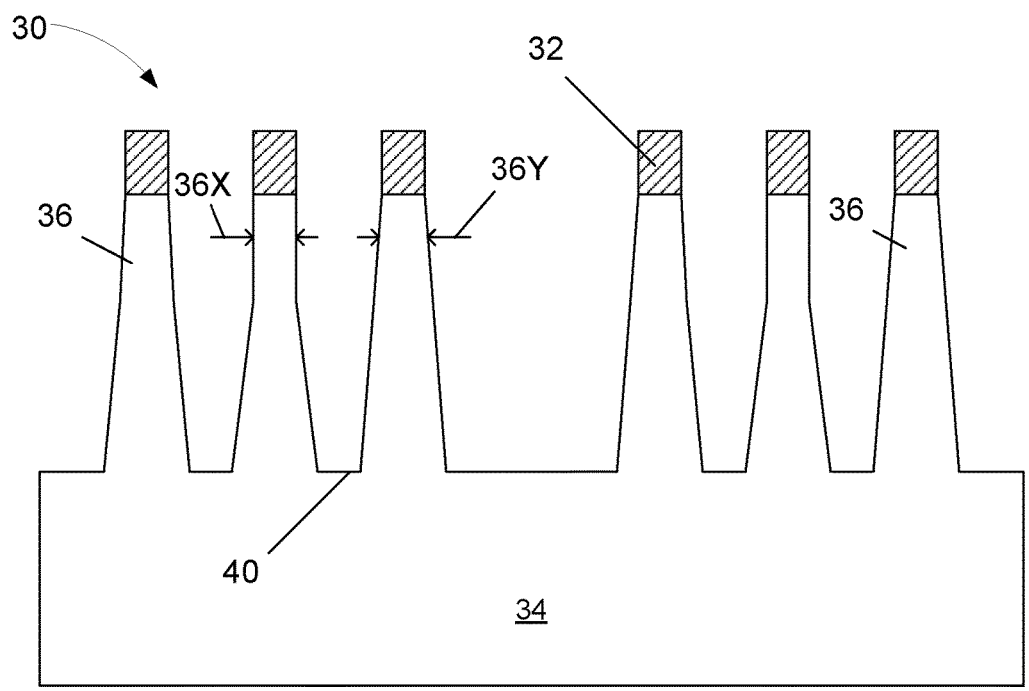
(Prior Art) Figure 1E
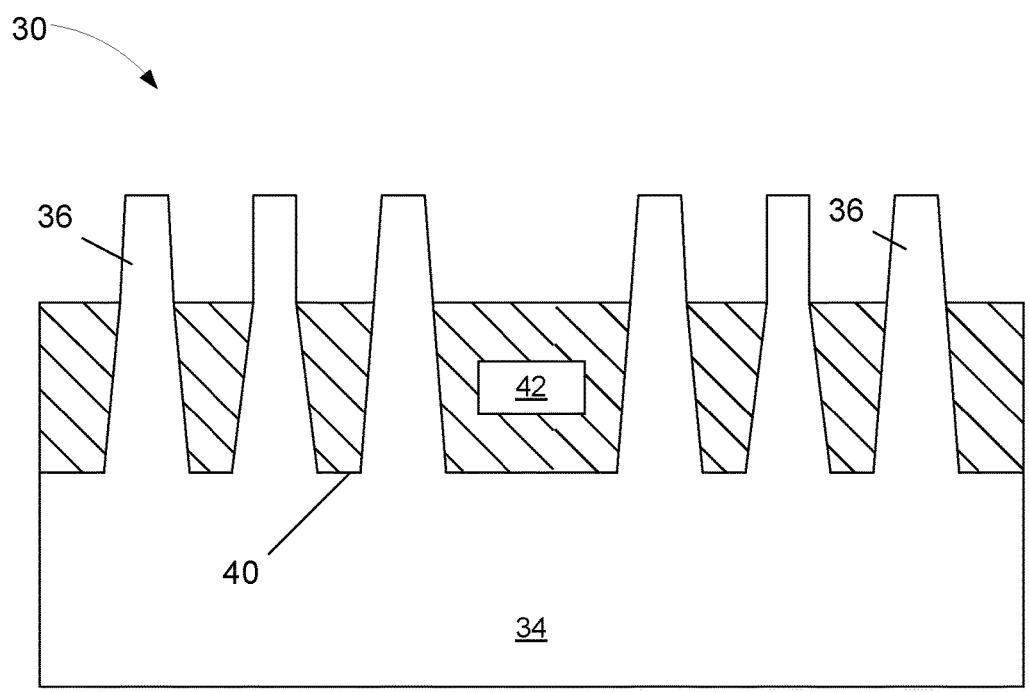
(Prior Art) Figure 1F

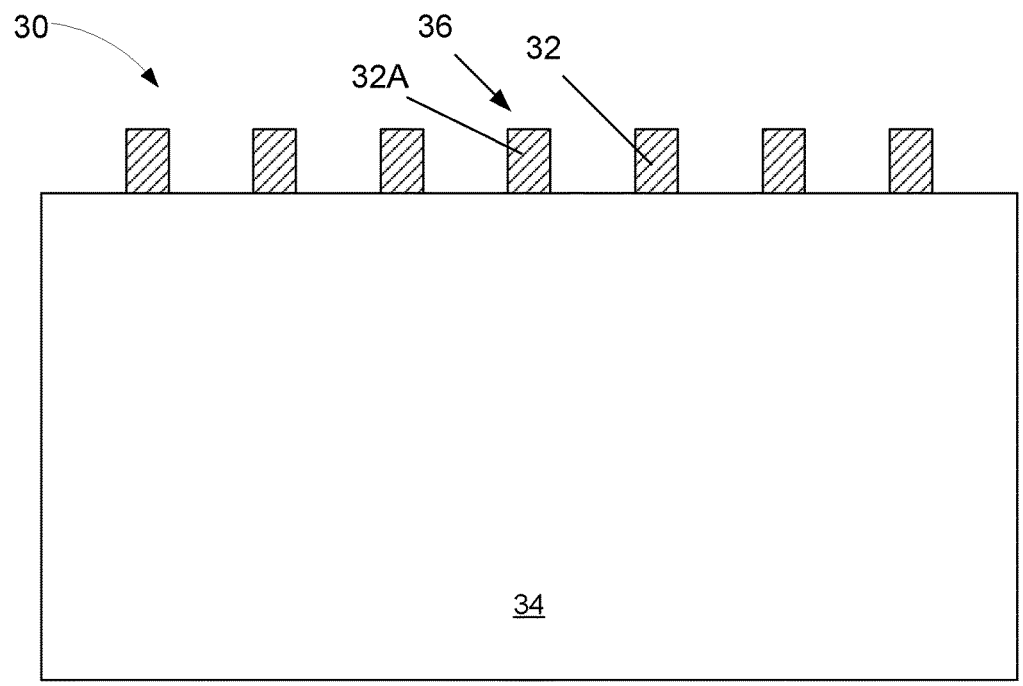
(Prior Art) Figure 1G
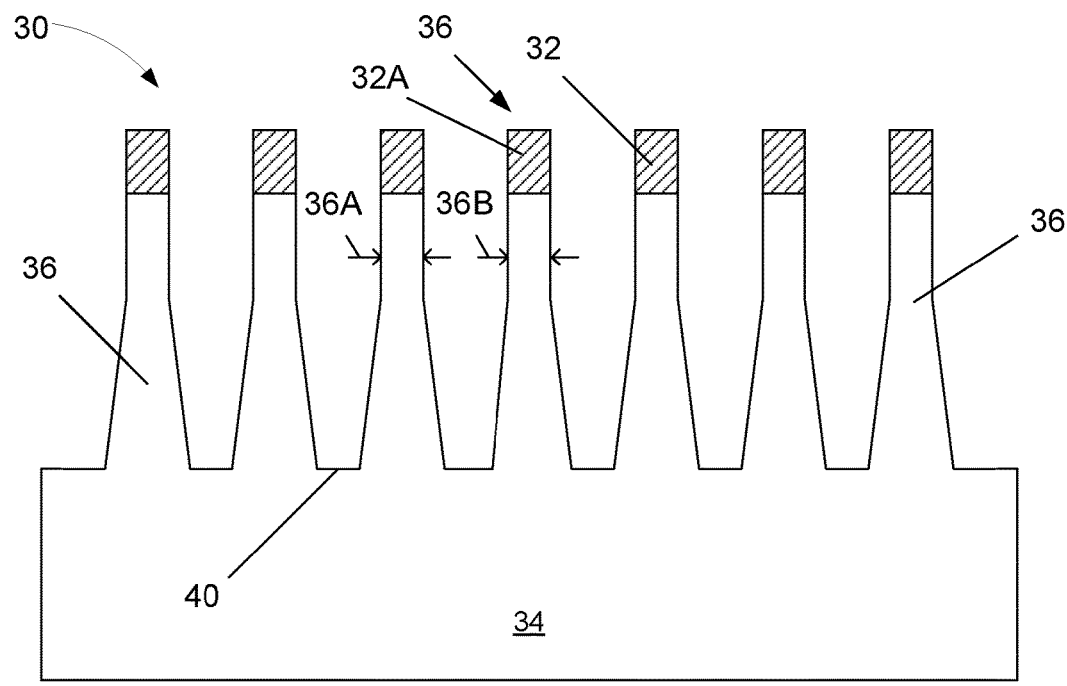
(Prior Art) Figure 1H

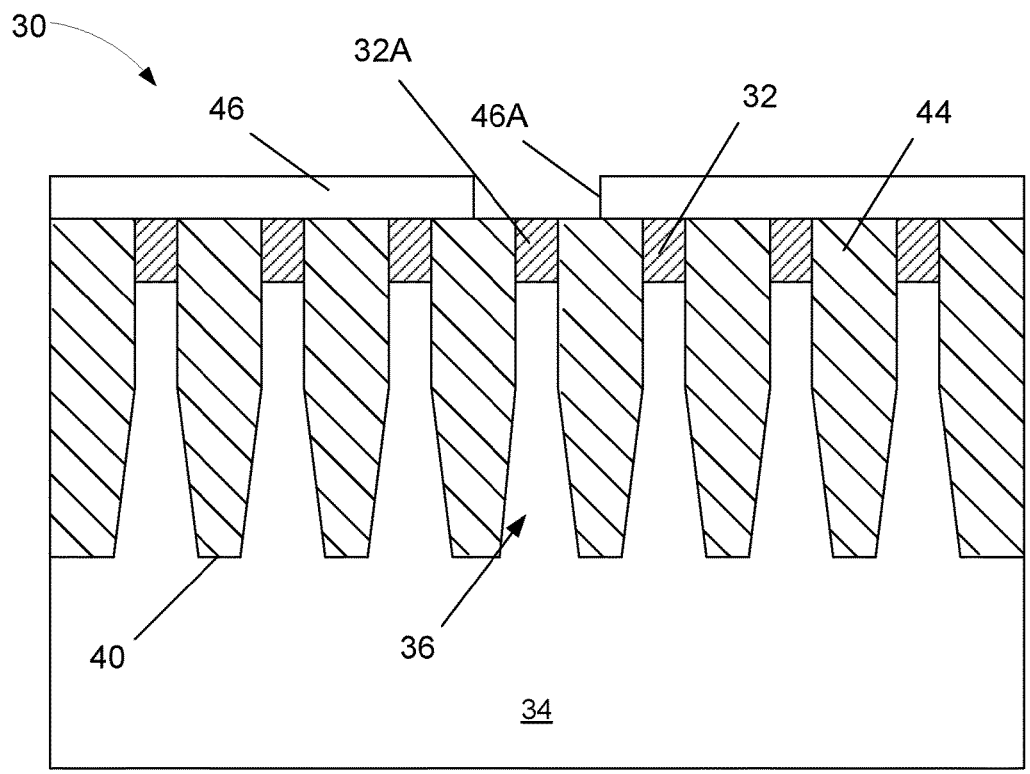
(Prior Art) Figure 1I
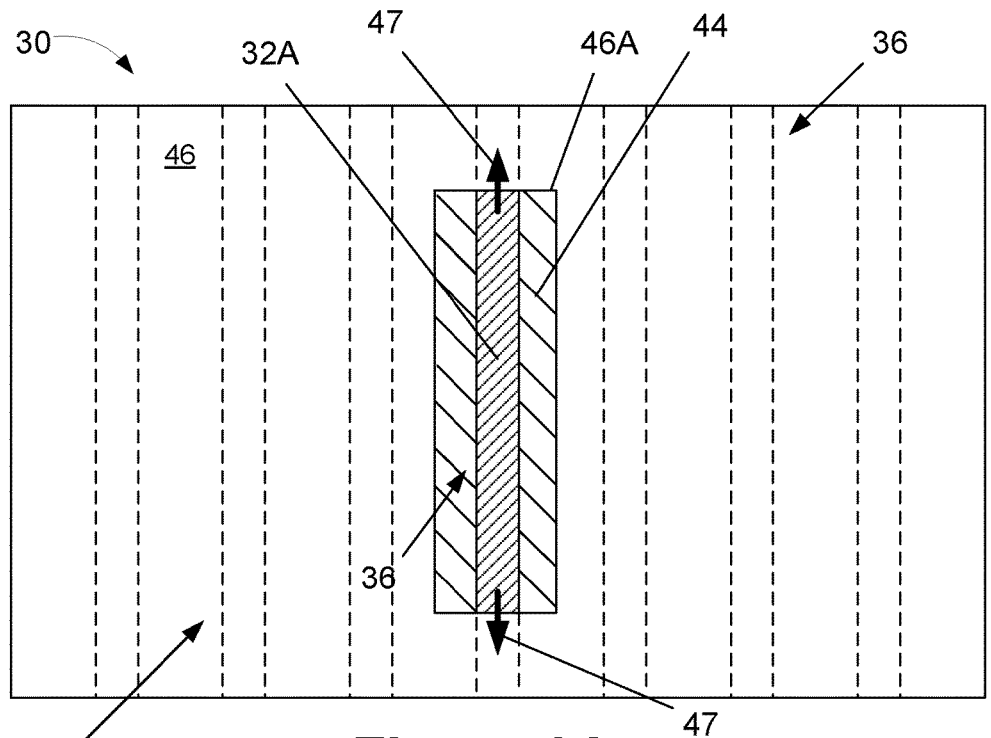
(Prior Art) Figure 1J

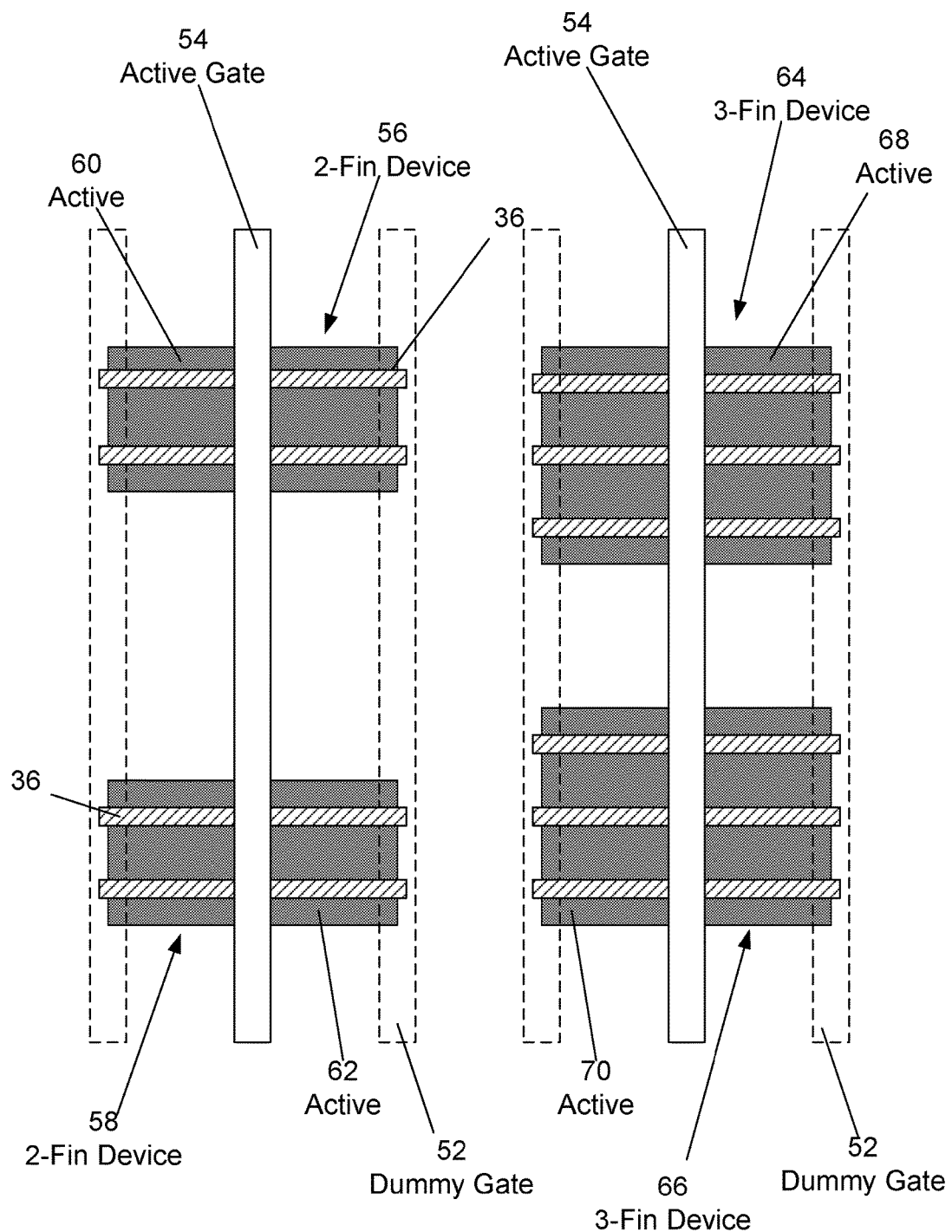
(Prior Art) Figure 1O

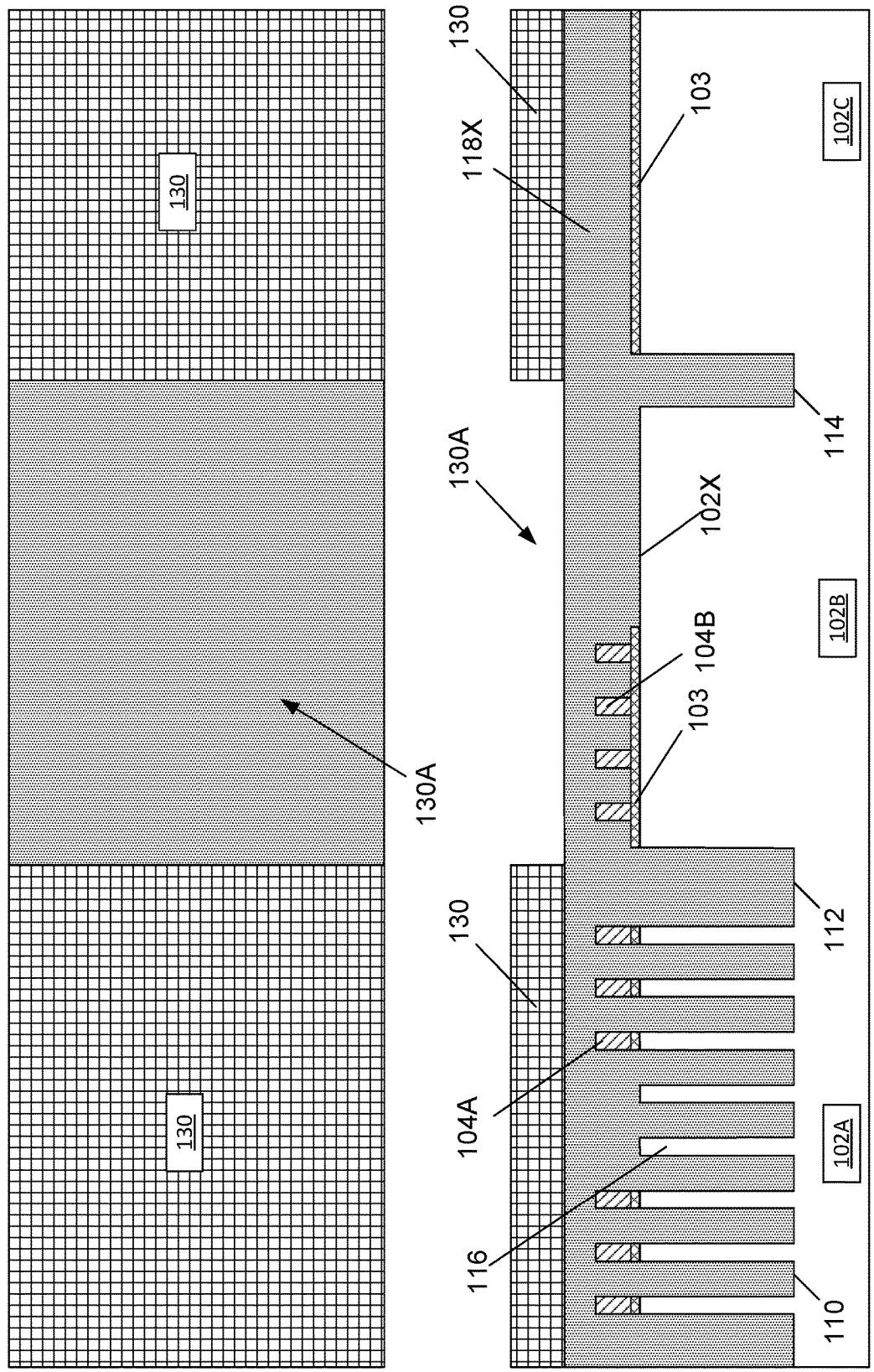

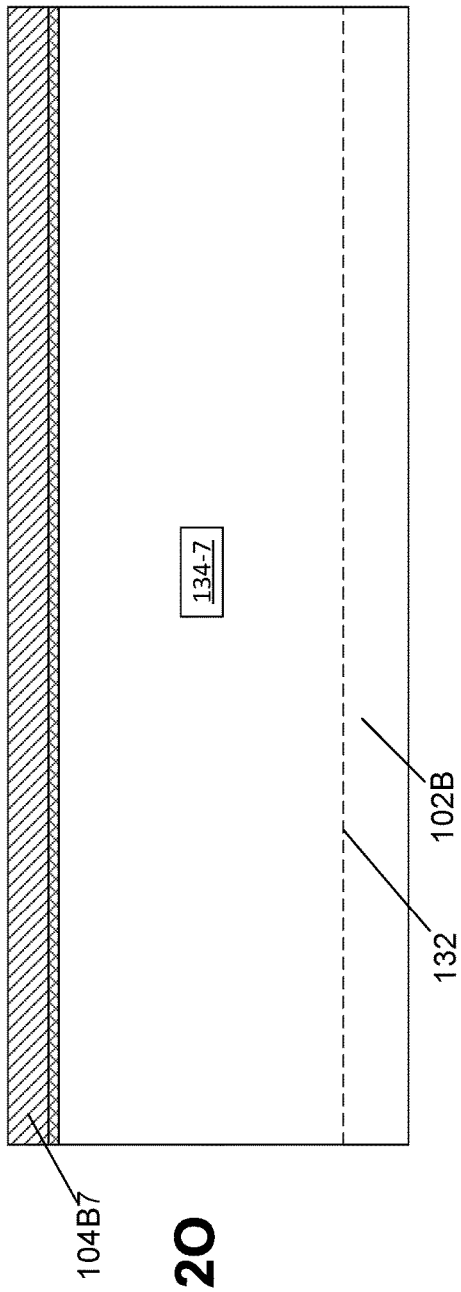
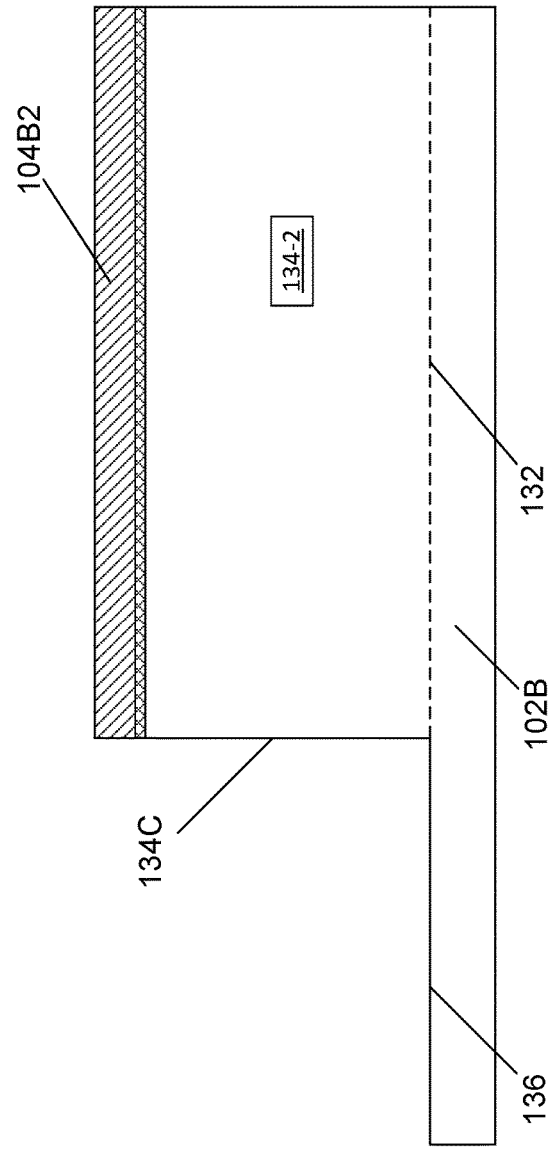

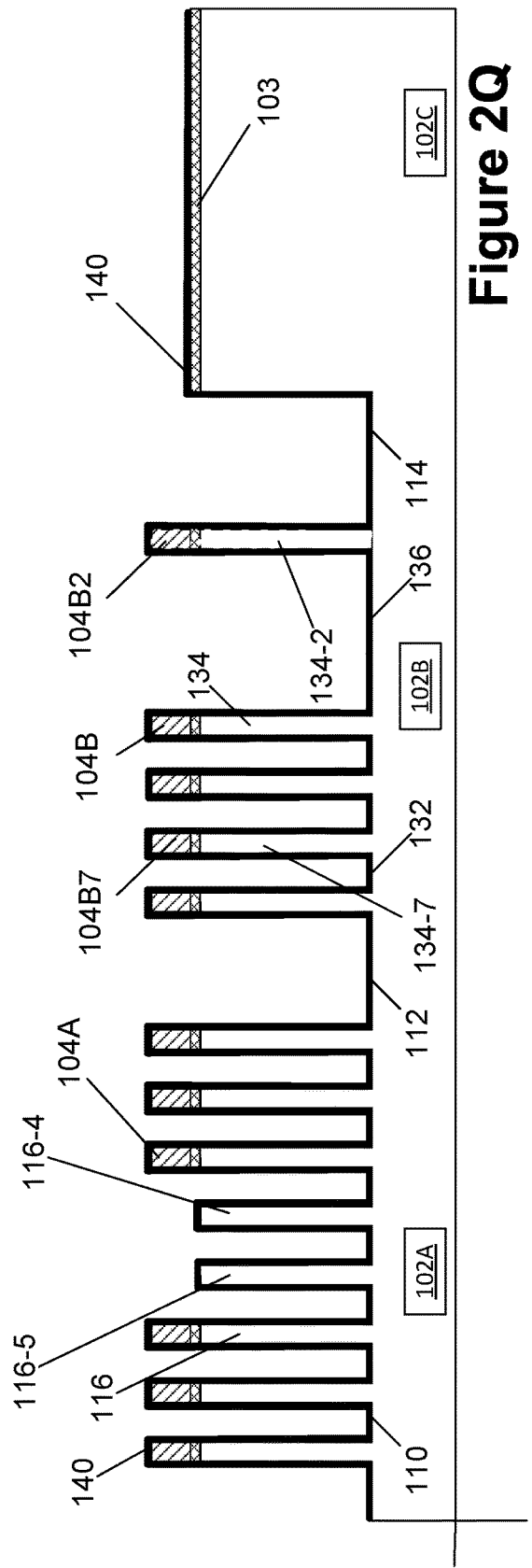

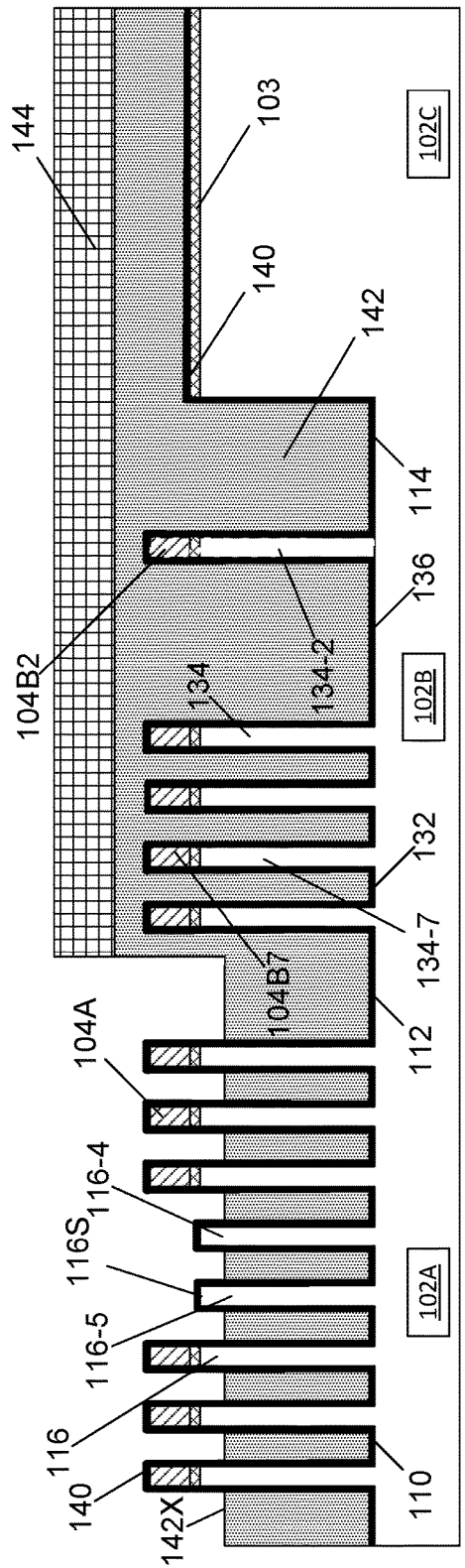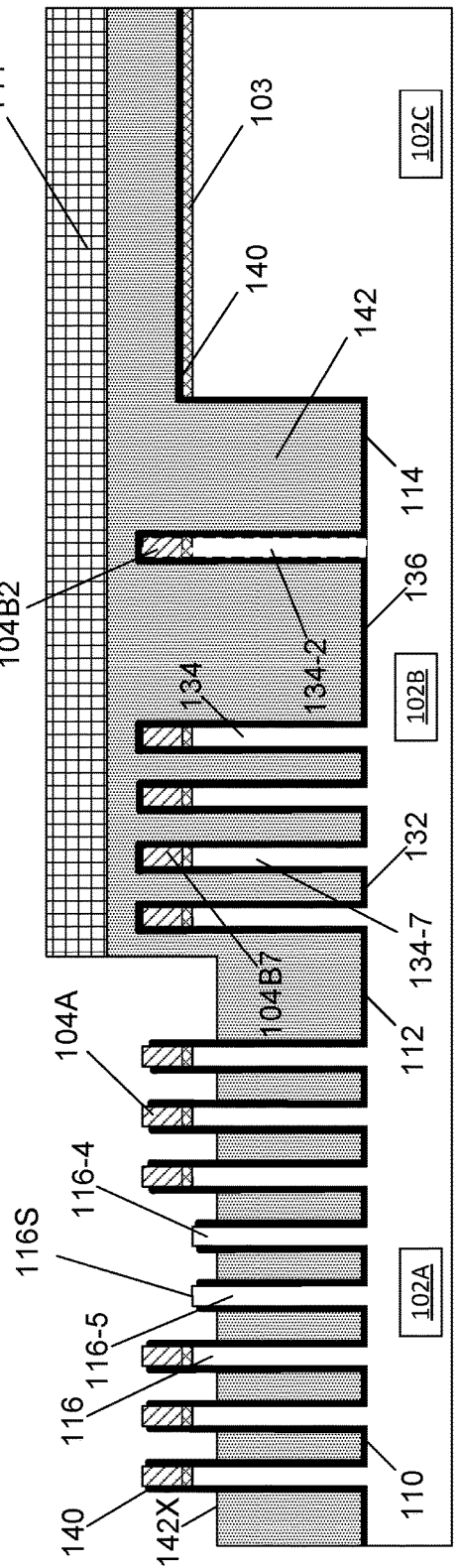

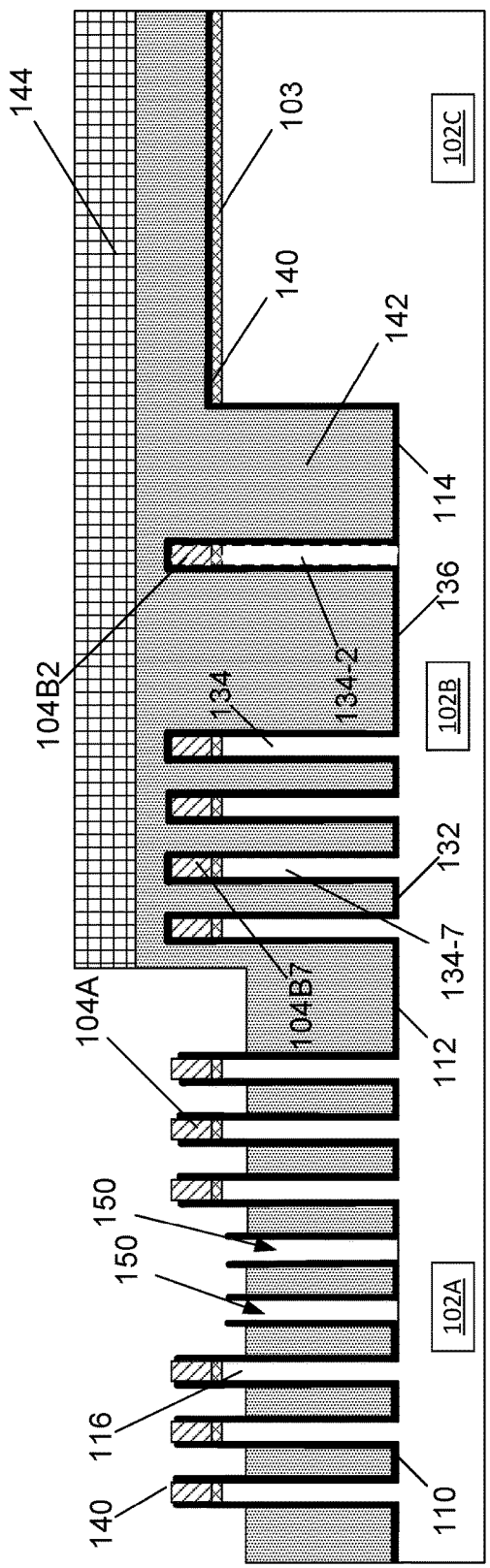
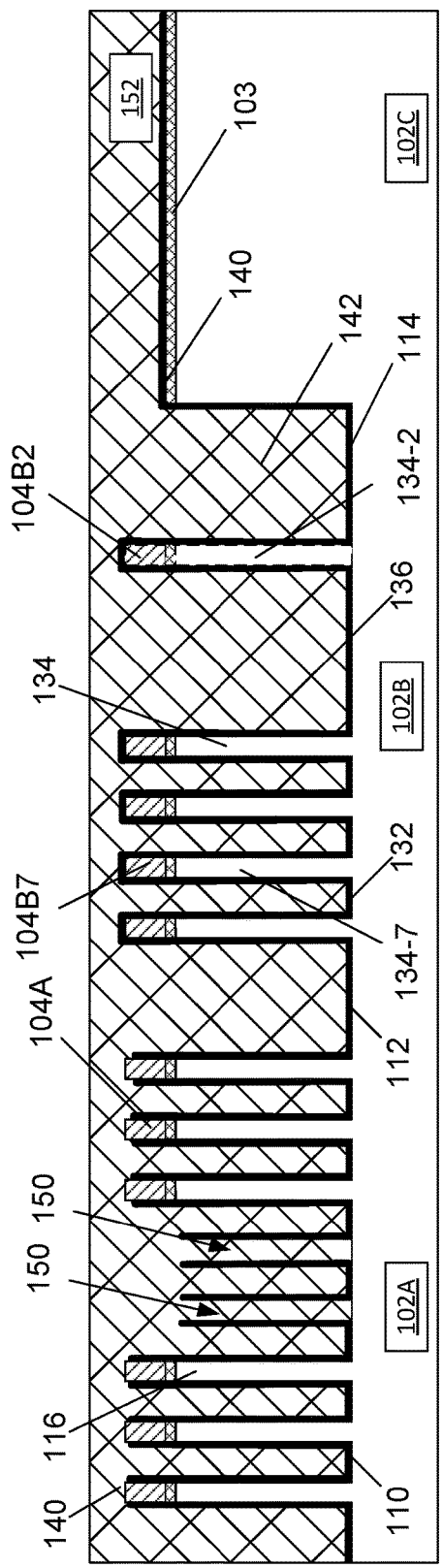
Figure 2W
Figure 2X

HYBRID FIN CUT ETCHING PROCESSES FOR PRODUCTS COMPRISING TAPERED AND NON-TAPERED FINFET SEMICONDUCTOR DEVICES

BACKGROUND OF THE INVENTION

1. Field of the Invention

The present disclosure generally relates to the fabrication of integrated circuits, and, more particularly, to various hybrid fin cut etching processes for integrated circuit products that include both tapered and non-tapered FinFET semiconductor devices.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

In contrast to a planar FET, which, as the name implies, is a generally planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap layer 20. A plurality of fin-formation trenches 22 are formed in the substrate 12 to define the fins 14. A recessed layer of insulating material 13 is positioned between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational, i.e., the gate length of the device 10. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region.

Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce undesirable short channel effects that were problematic as the gate length of planar devices was reduced over the years. Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior FET structure as compared to that of a planar FET, especially in the 20 nm CMOS technology node and beyond.

As FinFET devices have been scaled to meet ever increasing performance and size requirements, the width W of the fins 14 has become very small, e.g., 6-12 nm, and the fin pitch has also been significantly decreased, e.g., the fin pitch may be on the order of about 30-60 nm. Further reductions in these dimensions are anticipated in future product generations. Accordingly, accurately defining these relatively small fin structures can be challenging. One manufacturing technique that is employed in manufacturing FinFET devices is to initially form the trenches 22 in the substrate 12 to define multiple "fins" that extend across the entire substrate 12 in the regions where FinFET devices will be formed, and thereafter remove some of the fins where larger isolation structures will be formed. Using this type of manufacturing approach, better accuracy and repeatability may be achieved in forming the fins 14 to very small dimensions due to the more uniform environment in which the etching process that forms the trenches 22, and thus the fins 14, is performed.

After the fins 14 have been formed, some portion of some of the fins 14 must be removed to create room for or define the spaces where isolation regions will ultimately be formed to separate the individual FinFET devices from one another. As noted above, the fins 14 are typically formed in a regular array. Typically, two separate fin removal or "fin cut" etching processes, involving two different fin-cut masking layers, are performed to remove the unwanted fins (or portions thereof). One of these fin-removal etching processes is sometimes referred to as a so-called "FH cut" process.

The FH cut process involves forming an opening in the mask layer, wherein the long axis of the opening is substantially parallel to the long axis of the fins 14, i.e., the long axis of the opening in the masking layer runs in a direction that corresponds to the gate length direction of the finished FinFET devices (or a direction that is parallel to the long axis of the fins 14). In the FH fin cut process, portions of the axial length of the fins 14 exposed by an FH cut mask (e.g., photoresist) are removed. The FH fin cut process essentially defines the axial length of the active fins 14 that will be positioned above one or more active regions in completed devices. This FH fin cut process is typically an anisotropic cut process.

One such removal technique used for the FH fin cut process is typically referred to as "Fins-cut-First," as will be described with reference to FIGS. 1B-1F. However, in this process, the portion of the fin to be removed is not actually formed in the substrate. Rather, the patterned fin-formation etch mask 32 is modified such that the underlying substrate material where such a fin portion would otherwise be formed is removed when the fin-formation trenches 22 are etched into the substrate. Accordingly, FIG. 1B depicts a product 30 after a patterned fin-formation hard mask layer 32, e.g., a patterned layer of silicon nitride/silicon dioxide, was formed above the substrate 34 in accordance with the desired fin pattern and pitch. In the depicted example, only a single fin will be removed, i.e., the fin 36 (or portion thereof) that would otherwise correspond to the feature 32A, to make room for an isolation region. However, as will be recognized by those skilled in the art, depending upon the desired final size of the isolation region, portions of more than one fin may be removed using this Fins-cut-First approach.

FIG. 1C depicts the product 30 after a patterned masking layer 38, e.g., a patterned layer of photoresist, was formed above the patterned fin-formation hard mask layer 32. The patterned masking layer 38 has an opening that exposes the feature 32A (for a certain axial length into and out of the drawing page) for removal.

FIG. 1D depicts the product 30 after an etching process was performed through the patterned masking layer 38 so as to remove the portions of feature 32A of the patterned fin-formation hard mask layer 32 that were exposed by the patterned masking layer 38.

FIG. 1E depicts the device 30 after the patterned masking layer 38 was removed and after a fin-formation etching process was performed through the patterned fin-formation hard mask layer 32 (without the feature 32A) so as to define full-depth trenches 40 in the substrate 34 that define the desired fins 36 across the entire substrate. Due to the removal of the desired portion of the feature 32A, the fin-formation etching process removes the portions of the substrate 34 that would have otherwise formed a fin 36 in the area under the removed portions of the feature 32A. One problem with the Fins-cut-First approach is that it inevitably causes variations in fin sizes, i.e., the dimensions 36X and 36Y are different for different fins. This is especially true between fins 36 inside an array of fins and the fins at the edge of the active region that is close to the isolation region. Such variations in fin sizes may lead to unacceptable variations in device performance. Such variations in fin sizes are caused by variable etch loading effects wherein there are different etch rates that result in different etch profiles for the fins 36 due to differing patterning densities, pitch, etc. However, one benefit of the Fins-cut-First approach is that an anisotropic etching process may be performed when forming the trenches 40 since the technique involves removing substantially all of the substrate material where the undesired fin would have otherwise been formed and there is little chance of damaging laterally adjacent fin structures.

FIG. 1F depicts the product 30 after several process operations were performed. First, a layer of insulating material 42, such as silicon dioxide, was formed so as to overfill the trenches 40. Next one or more chemical mechanical polishing (CMP) processes were performed to planarize the upper surface of the insulating material 40 with the top of the fins 36 and thereby remove the patterned fin-formation hard mask 32. Thereafter, an etch-back process was performed to recess the layer of insulating material 42 between the fins 36 and thereby expose the upper portions of the fins 36, which corresponds to the final fin height of the fins 36. Next, a gate structure (not shown) for the product 30 may be formed using either gate-first or gate-last manufacturing techniques.

Another technique employed during the FH cut process is typically referred to as "Fins-cut-Last," and it will be generally described with reference to FIGS. 1G-1L. FIG. 1G depicts the product 30 after the patterned fin-formation hard mask layer 32 was formed above the substrate 34 in accordance with the desired fin pattern and pitch across all areas of the substrate where FinFET devices will be formed. As before, in the depicted example, only a single fin (or portion thereof) will be removed, i.e., the fin 36 corresponding to the feature 32A, to make room for the isolation region.

FIG. 1H depicts the product 30 after an anisotropic fin-formation etching process was performed through the patterned fin-formation hard mask layer 32 so as to define the full-depth trenches 40 in the substrate 34 that define the fins 36 across the entire substrate in the areas where FinFET devices will be formed. Note that, in the Fins-cut-Last approach, the size of the fins is very uniform, i.e., the dimension 36A is approximately equal to the dimension 36B. This is primarily due to the fact that, in this approach, fins 36 are formed everywhere on the wafer where FinFET devices will be formed in a substantially uniform etch environment, i.e., there is no undesirable etch loading effects to cause variations in fin sizes.

FIGS. 1I-1J depict the device 30 after several process operations were performed. First, a layer of insulating material 44, such as silicon dioxide, was formed so as to overfill the trenches 40. Then a CM' process was performed to planarize the upper surface of the layer of insulating material 44 with the patterned fin-formation hard mask layer 32. Next, a patterned fin-cut masking layer 46, e.g., a patterned layer of photoresist, was formed above the layer of insulating material 44. The patterned fin-cut masking layer 46 has an opening 46A positioned above the portion of the underlying fin 36 that is to be removed. FIG. 1J is a plan view of the patterned fin-cut masking layer 46 with a generally rectangular-shaped opening 46A that exposes a desired portion of the axial length of the feature 32A of the patterned fin-formation hard mask layer 32 that is to be removed along with the corresponding portion of the axial length of the underlying fin 36.

FIG. 1K depicts the device 30 after one or more anisotropic etching processes were performed to remove the exposed portions of the layer of insulating material 44, the exposed portions of the feature 32A of the patterned fin-formation hard mask layer 32 and the underlying portions of the fin 36. This results in the formation of a trench 45 in the layer of insulating material 44. Typically, as shown in the plan view in FIG. 1J, the trench 45 will take the form of a rectangle that corresponds approximately to the opening 46A in the patterned fin-cut masking layer 46. Inevitably, there will be some inward tapering of the sidewalls of the trench 45. Although not depicted in the drawings, after the trench 45 is formed, the patterned fin-cut masking layer 46 will be removed and additional oxide material (not shown) will be formed through the opening 45A in the trench 45 where the portion of the fin 36 was removed. Then a chemical mechanical polishing (CMP) process will be performed to planarize the upper surface of all of the insulating materials with the top of the patterned fin-formation hard mask layer 32. Thereafter, the isolation regions between devices will be masked and an etch-back process will be performed to recess the layer of insulating material 44 between the fins 36 for each device and thereby expose the upper portions of the fins 36, which corresponds to the final fin height of the fins 36.

There are at least two possible problems with the fins-cut-last approach that generally relate to the size or critical dimension (CD) 45X of the opening 45A of the trench 45. With reference to FIG. 1L, if the CD 45X of the opening 45A is too small, there will typically be some residual portion 36X of the fin 36 remaining at the bottom of the trench 45. If the CD 45X of the opening 45A is increased in an effort to insure complete removal of the unwanted residual fin materials 36X at the bottom of the trench 45, then there is a much greater likeli-hood of damaging the fins 36 adjacent the trench 45 when the fin removal etch process is performed. These issues only get worse as the depth of the trench 45 increases and as packing densities increase.

Some of the aforementioned problems could potentially be remedied by performing a selective isotropic etching process to remove the desired portions of the fin 36 instead of performing an anisotropic etching process. FIGS. 1M-1N depict the device 30 after an isotropic etching process was performed to remove the desired portions of the fin 36 exposed by the opening 46A in the patterned fin-cut masking layer 46. FIG. 1N is a cross-sectional view taken through the long axis of the fin 36 that is cut during the isotropic etching process. One benefit of performing an isotropic fin cut etching process is that, due to the isotropic nature of the process, any undesirable residual fin material 36X (see FIG. 1L) at the bottom of the trench 45 may be eliminated. As shown in FIG. 1N, performing an isotropic fin-removal etching process results in the formation of a small trench 48 in the substrate 34. Typically, only a portion of the entire axial length of the fin 36 will be removed as other portions of the initially formed fin 36 will serve as permanent fins 36A for other FinFET devices. Due to the isotropic nature of the fin removal etching process, the cut ends 50 of the permanent fins 36A that are adjacent the portion of the fin 36 that was removed may be subjected to relatively severe undercutting, as depicted in FIG. 1N. That is, due to the nature of an isotropic etching process, there may be some undesirable loss of the fin material in the directions indicated by the arrows 47 in FIG. 1J.

As it relates to the formation of FinFET devices, the number of fins of a FinFET device is an important consideration. In general, a FinFET device with a greater number of fins tends to exhibit greater performance, i.e., drive current, than a FinFET device with a lesser number of fins. Accordingly, all other things being equal, a FinFET device with a relatively greater number of fins would be a candidate for various high performance applications, such being included as part of a critical path for a logic circuit on an integrated circuit product. On the other hand, FinFET devices with a lesser number of fins may be more suitable for applications involving less relative power consumption, as such FinFET devices tend to exhibit relatively lower off-state leakage currents. Accordingly, such FinFET devices may be employed in non-critical path circuits where power consumption and power management is an important factor.

In general, there are two different ways that may be employed in an attempt to produce FinFET devices with different numbers of fins. Historically, FinFET devices have been formed in and above active regions that have a rectangular configuration. FIG. 1O is a simplistic depiction of one illustrative example of how different FinFET devices, each having a different number of fins, may be formed above spaced-apart active regions that have a rectangular configuration. As shown therein, the product is comprised of a plurality of fins 36, a plurality of dummy gates 52 and a plurality of active gates 54. First and second FinFET devices 56, 58 (each of which are two-fin devices) are formed in and above spaced-apart rectangular active regions 60, 62, respectively. FIG. 1O also depicts first and second FinFET devices 64, 66 (each of which are three-fin devices) formed in and above spaced-apart rectangular active regions 68, 70, respectively. Such a configuration does result in a plurality of FinFET devices 56, 58, 64 and 66 having a different number of fins. However, each of the FinFET devices are formed above spaced-apart, rectangular shaped active regions 60, 62, 68 and 70, respectively. One positive aspect of the embodiment shown in FIG. 1O is that there is little or no undercutting of the cut end surface 50 of the fins, as described in FIGS. 1M-1N above (see surface 50 in FIG. 1N). One negative aspect of the approach depicted in FIG. 1O, is that there is a relatively significant area penalty (e.g., 10-20%) associated with forming the four spaced-apart, rectangular active regions 60, 62, 68 and 70.

FIG. 1P depicts another illustrative way wherein FinFET devices may be formed with a different number of fins. In this embodiment, so-called "tapered" FinFET devices 80, 82 are formed in and above substantially non-rectangular shaped active regions 84, 86, respectively, wherein the substantially non-rectangular active area occupies less area than that of a normal four-sided rectangle of similar dimensions. This definition of "tapered devices" and "substantially non-rectangular shaped active regions" shall be used in the specification and throughout the claims. The term "substantially" is employed as part of the definition so that precise geometric precision with respect to the configuration of the non-rectangular shaped active regions is not required due to the variabilities that may be encountered when performing etching processes to define the active regions.

At the bottom of FIG. 1P, one example of the substantially non-rectangular shaped active region 86 is shown by itself so as to clearly show its substantially non-rectangular configuration when viewed from above. A FinFET device formed above a substantially non-rectangular shaped active region (as opposed to a traditional rectangular shaped active region) may be generally referred to as a "tapered" FinFET device, in that the substantially non-rectangular shaped active region is configured or tapered (i.e., substantially non-rectangular) so as to allow formation of FinFET devices (with different numbers of fins) above that tapered, substantially non-rectangular shaped active region. In the depicted example, each of the tapered FinFET devices 80, 82 include a two-fin FinFET device and a three-fin FinFET device. Such tapered FinFET devices offer significant scaling benefits as compared to the traditional FinFET devices shown in FIG. 1O that are formed above the spaced-apart traditional rectangular active regions 60, 62, 68 and 70.

After the fins are cut, and the isolation regions are formed, the gate structures are then formed across the fins. In the case where a replacement gate process is used to manufacture the FinFET devices, the initial gate structures are sacrificial gate structures that will subsequently be removed and replaced with final gate structures for the devices. Several process operations are performed after the formation of the sacrificial gate structures, e.g., the formation of epi semiconductor material in the source/drain regions of the device. When the epi semiconductor material is formed in the source/drain regions, it is important that the epi material not form in unwanted areas of the devices so as to not create a multitude of problems, e.g., growing around the end of a gate structure so as to create a short circuit between the source region and drain region, bridging the space between two adjacent active regions, etc. Thus, with reference to FIG. 1Q, when the fins are cut, the cut is located such that the cut ends of the fins will be positioned under the dummy gate structures when they are formed. This is sometimes referred to as the fins being "tucked" in the sense that the cut end of the fin is positioned under or "tucked under" the dummy gate structure. Such a tucked fin arrangement is required on many modern integrated circuit products so as to prevent the undesirable formation of epi semiconductor material in undesirable places and to produce uniform source/drain regions (when the epi material is formed) for all of the devices so as to avoid variances in device performance.

FIG. 1R is an idealized depiction of a tapered device 80 that is formed above a substantially non-rectangular active area 84. As depicted, all of the fins 36 are properly tucked under a gate structure 52, as indicated in the dashed line regions 55. However, in fabricating a real-world device using a single mask to define the substantially non-rectangular active area 84 and the fins 36, there is unavoidable corner rounding 85 of a portion of the active region 84, as shown in FIG. 1S. As a result of this corner rounding, the fin 36A is axially shorter than intended, while the fin 36B is axially longer than intended. The net result is that when the gate 52 (shown in dashed lines) is formed, the fins 36A and 36B will not be properly tucked under the gate 52. More specifically, the fin 36A will be short of the gate 52 (as depicted in the dashed line region 87), while the fin 36B will extend beyond the gate 52 (as depicted in the dashed line region 89). As a result of the foregoing, the untucked portions of the fins 36A, 36B can serve as sites for undesirable epi growth when epi material is formed in the source/drain regions of the FinFET devices.

To eliminate the above-described problem of corner rounding 85 of the substantially non-rectangular active area 84 for tapered devices, two separate masking layers can be used when defining the fins 36 in the substrate. In the two-mask layer approach, the separately formed FH mask and the FP mask are formed such that they overlap so as to define an essentially right-angle corner in the area where the corner rounding 85 occurs when the single masking layer approach is used. However, even when the double mask approach is used, when an isotropic etch process is performed in the fin cut last process to remove the undesirable portions 36X of the fins 36 (see FIGS. 1L-1N), there will still be some undesirable undercutting (like the cut ends 50 shown in FIG. 1N) of the fins for the tapered device. On the other hand, performing a fin-cut-first process avoids the problem of undercutting of the fins for the tapered device, but, as noted above, the fin-cut-first process can lead to undesirable variations in the dimensions of the fins which can adversely affect the performance of some devices, such as those devices in high-performance areas like logic circuits or SRAM circuits, etc.

The present disclosure is directed to various hybrid fin cut etching processes for integrated circuit products that include both tapered and non-tapered FinFET semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various hybrid fin cut etching processes for integrated circuit products that include both tapered and non-tapered FinFET semiconductor devices. For an integrated circuit product comprising a non-tapered FinFET device formed in a first region of the substrate and a tapered FinFET device in a second region of the substrate, the method includes, among other things, while masking the second region, forming a first plurality of fins for the non-tapered FinFET device in the first region by performing a fin-cut-last process that comprises initially forming the first plurality of fins in the first region and thereafter removing a portion of at least one of the previously formed first plurality of fins and, while masking the first region, forming a second plurality of fins in the second region by performing a fin-cut-first process that comprises initially removing a portion of at least one of a plurality of features of a patterned fin-formation etch mask layer positioned above the second region so as to define a modified patterned fin-formation etch mask and thereafter performing an etch process through the modified patterned fin-formation etch mask to define the second plurality of fins for the tapered FinFET device.

For an integrated circuit product comprising a non-tapered FinFET device formed in a first region of the substrate and a tapered FinFET device in a second region of the substrate, another illustrative method includes, among other things, forming a patterned fin-formation etch mask layer above both the first and second regions, while masking the patterned fin-formation etch mask layer in the second region, performing an anisotropic etching process through the patterned fin-formation etch mask layer to form a first plurality of fins in the first region and, after forming the first plurality of fins, removing a portion of at least one of a plurality of features of the patterned fin-formation etch mask layer that are positioned above the second region. In this example, the method also includes, after removing a portion of at least one of the plurality of features of the patterned fin-formation etch mask layer, and while masking the patterned fin-formation etch mask layer in the first region, performing an anisotropic etching process through the patterned fin-formation etch mask layer to form a second plurality of fins in the second region and, after forming the second plurality of fins, forming a masking layer that covers the patterned fin-formation etch mask layer in the second region and thereafter performing an isotropic etching process through the patterned fin-formation etch mask to remove at least a portion of at least one of the first plurality of fins in the first region.

BRIEF DESCRIPTION OF THE DRAWINGS

The disclosure may be understood by reference to the following description taken in conjunction with the accompanying drawings, in which like reference numerals identify like elements, and in which.

Figure 1K:
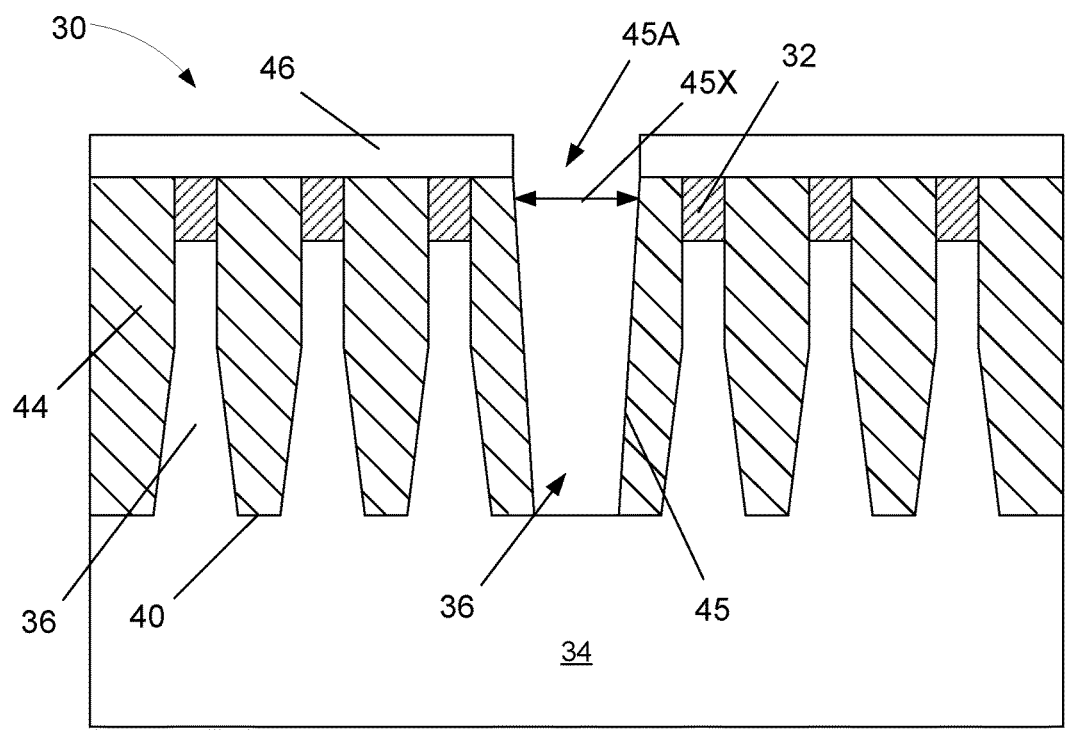
FIGS. 1A-1S depict various prior art fin removal process operations and problems that may be encountered when performing such prior art processes on integrated circuit products comprising both tapered and non-tapered FinFET devices.
Figure 1L:
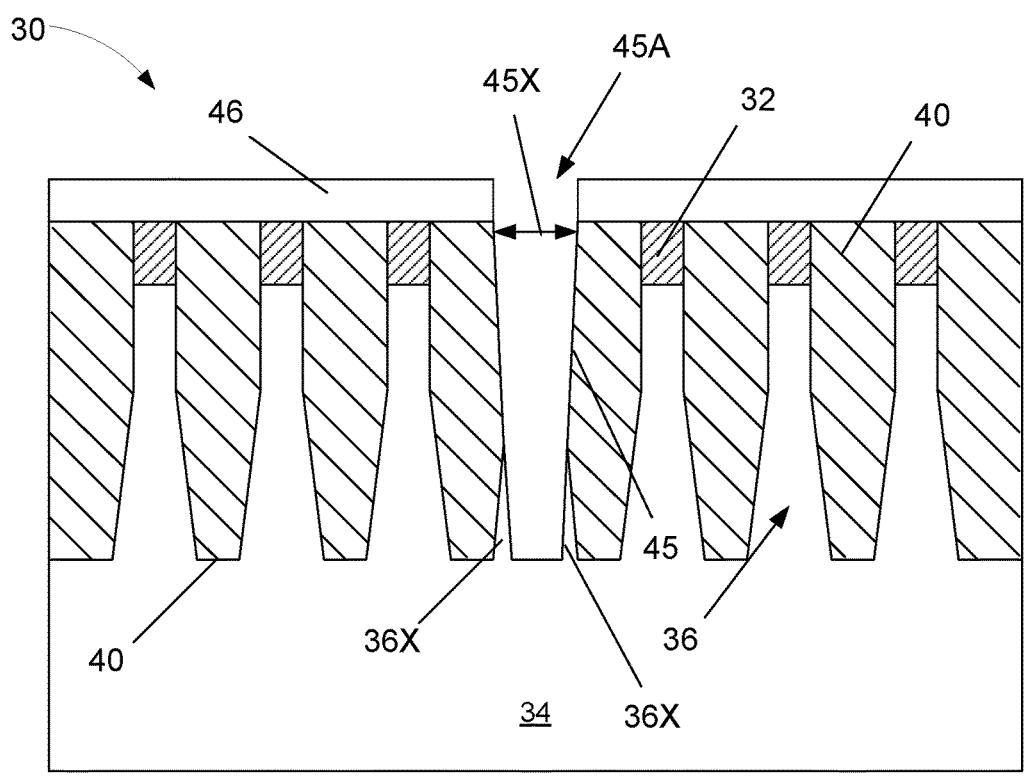
Figure 1M:
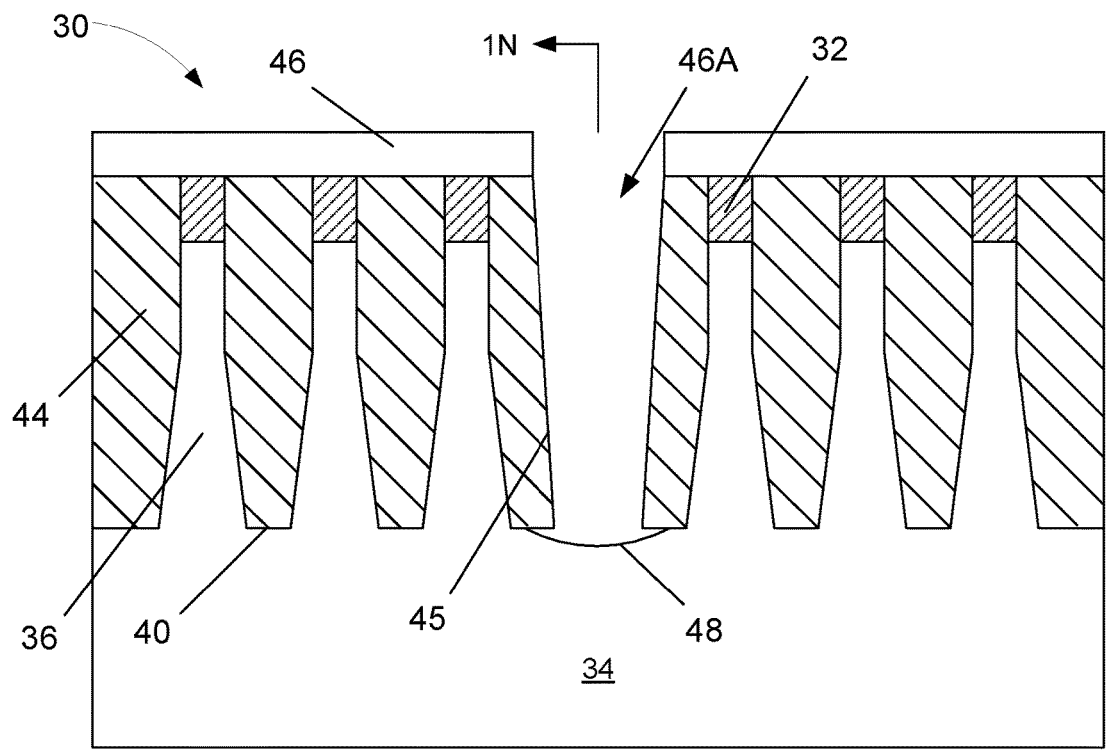
Figure 1N:
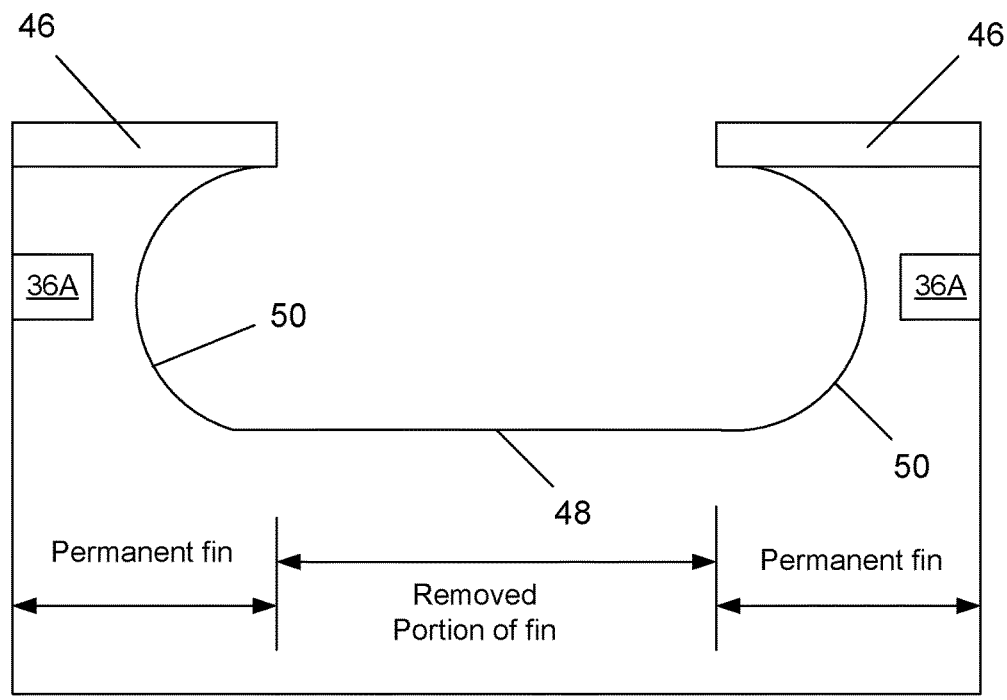
Figure 1P:
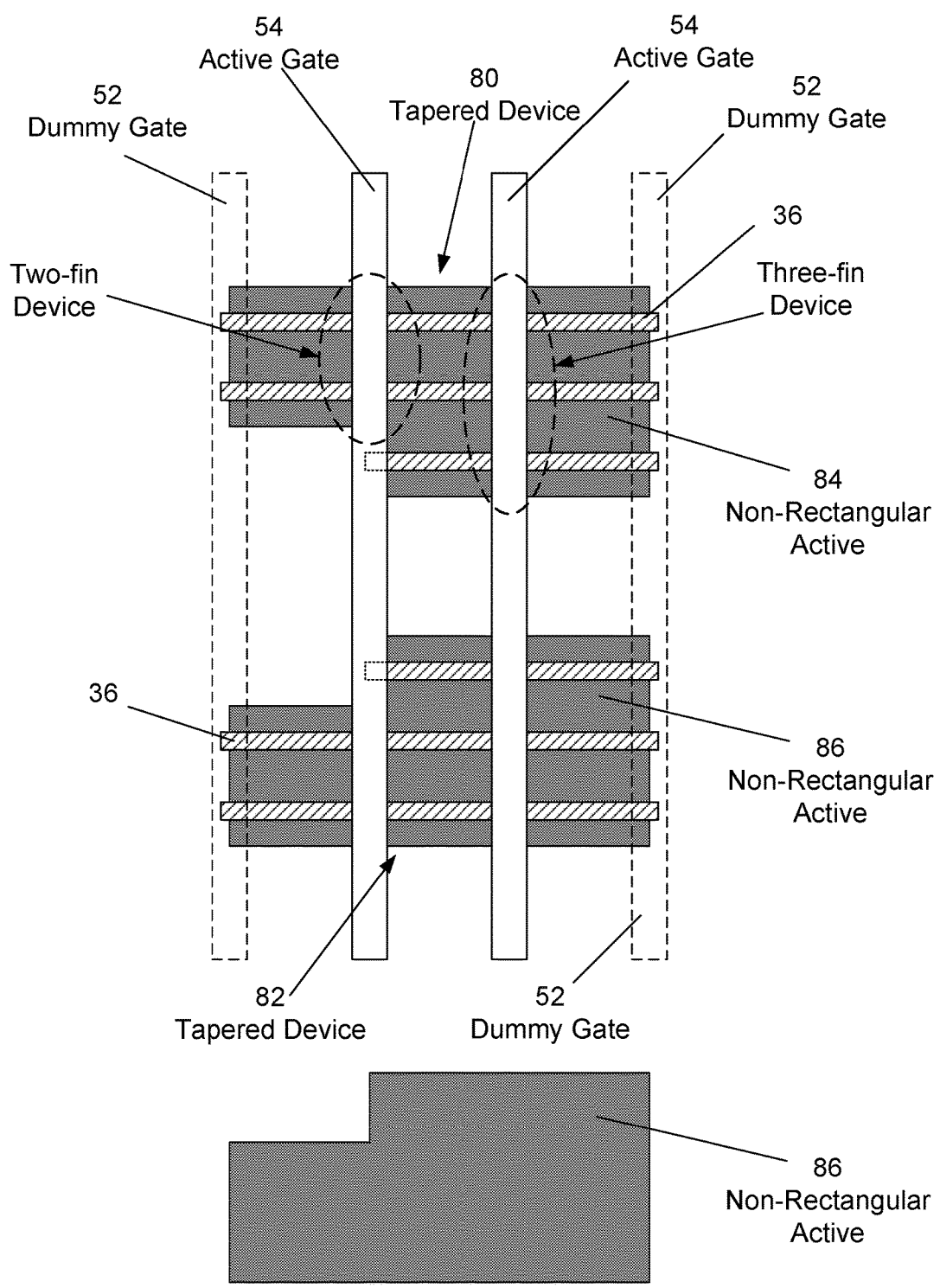
Figure 1Q:
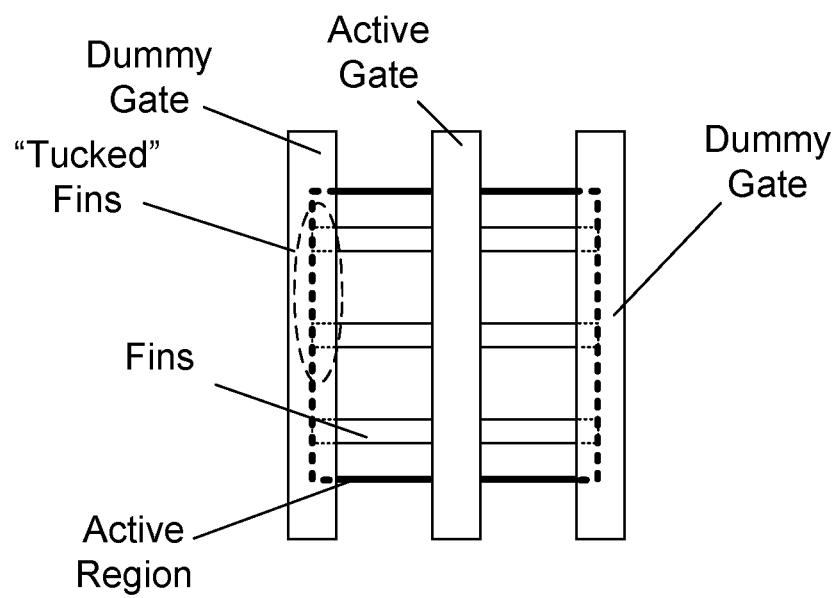
Figure 1R:
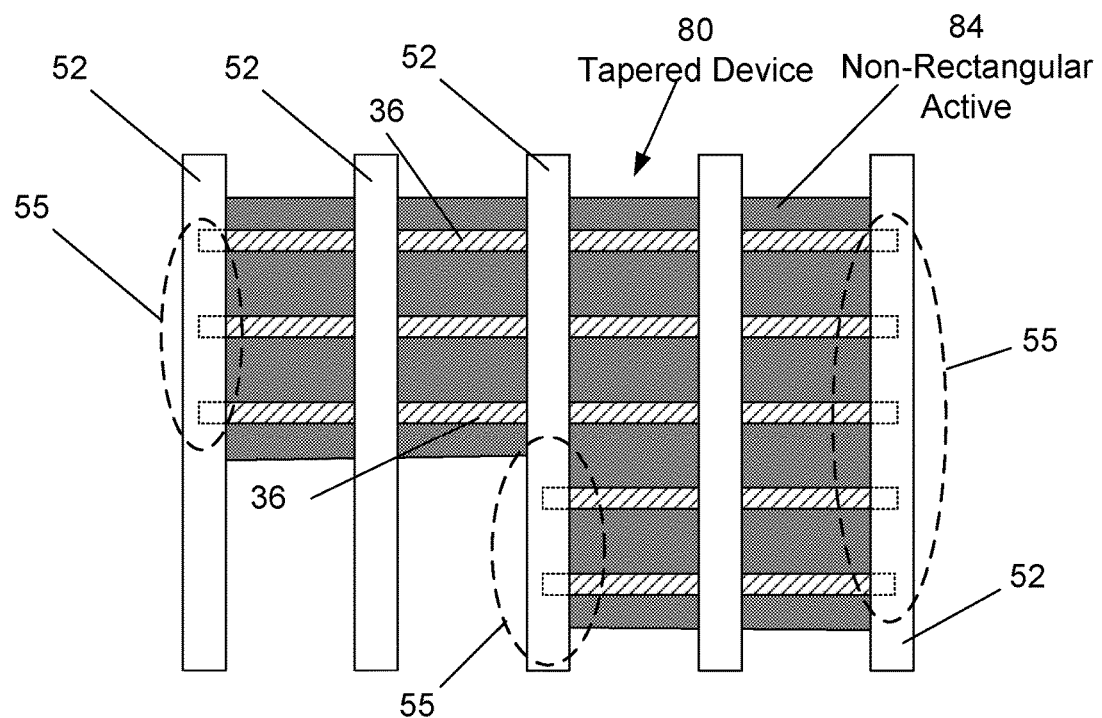
Figure 1S:
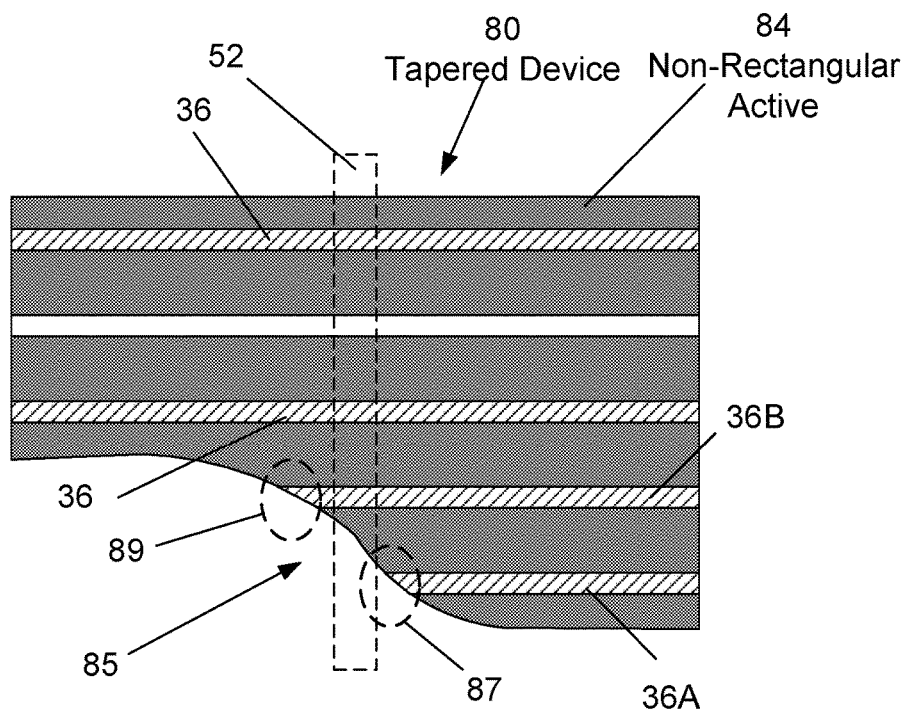

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various hybrid fin cut etching processes that may be performed on integrated circuit products that include both tapered and non-tapered FinFET semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs. The inventions disclosed herein should not be considered to be limited to the illustrative examples depicted and described herein. The various components and structures of the integrated circuit products 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
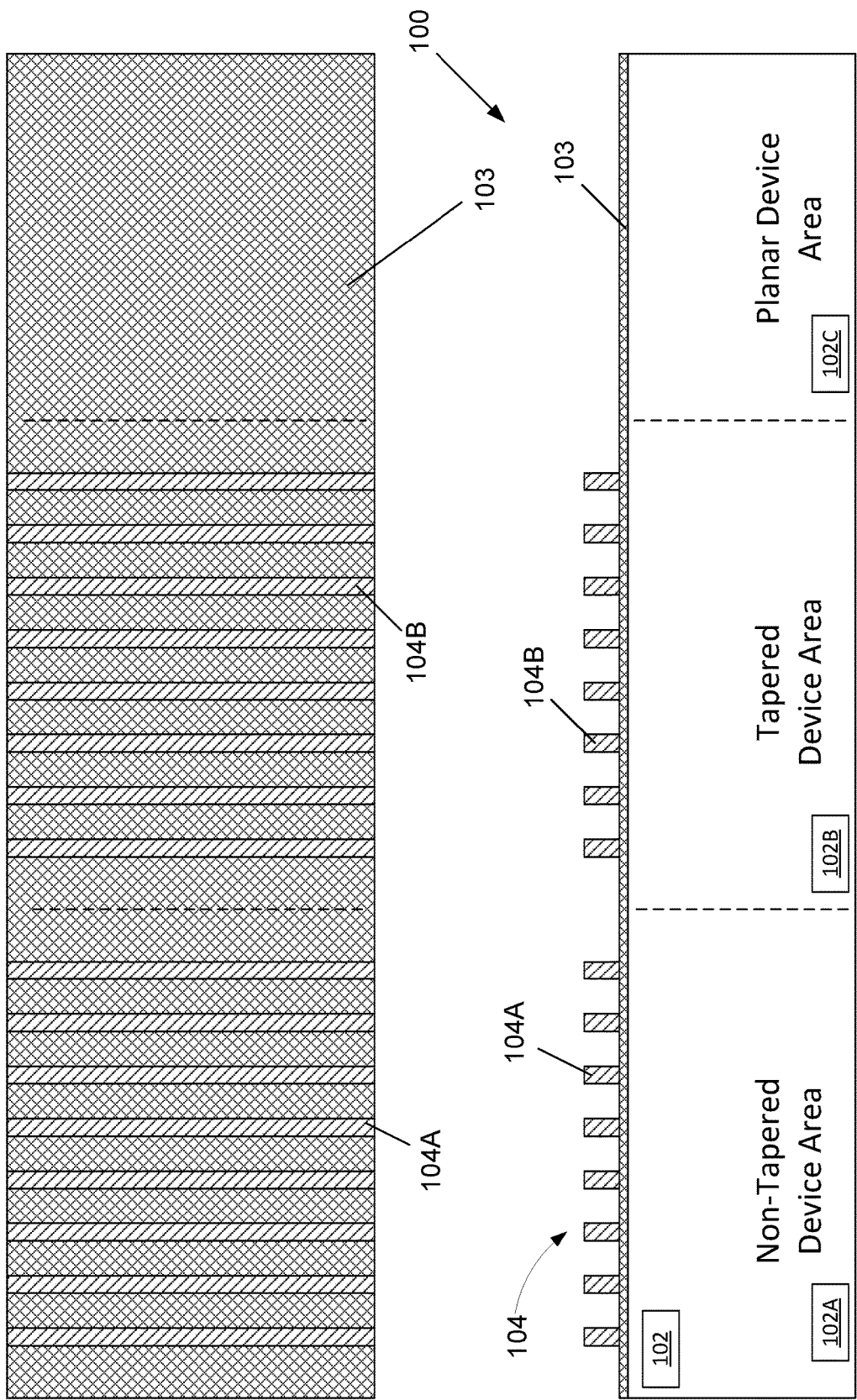
FIGS. 2A-2Z depict various hybrid fin cut etching processes that may be performed on integrated circuit products that include both tapered and non-tapered FinFET semiconductor devices.
Figure 2B:
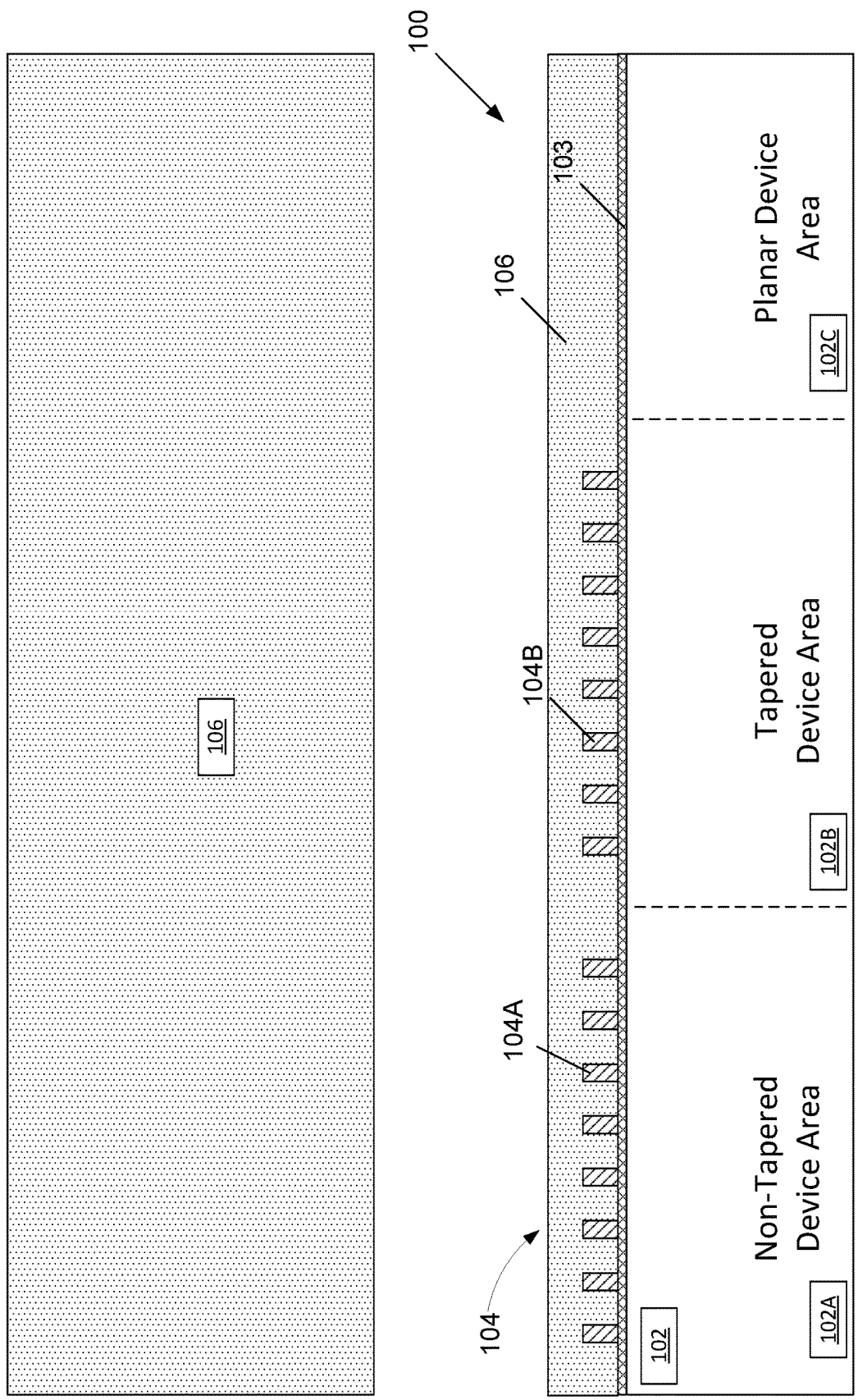
Figure 2C:
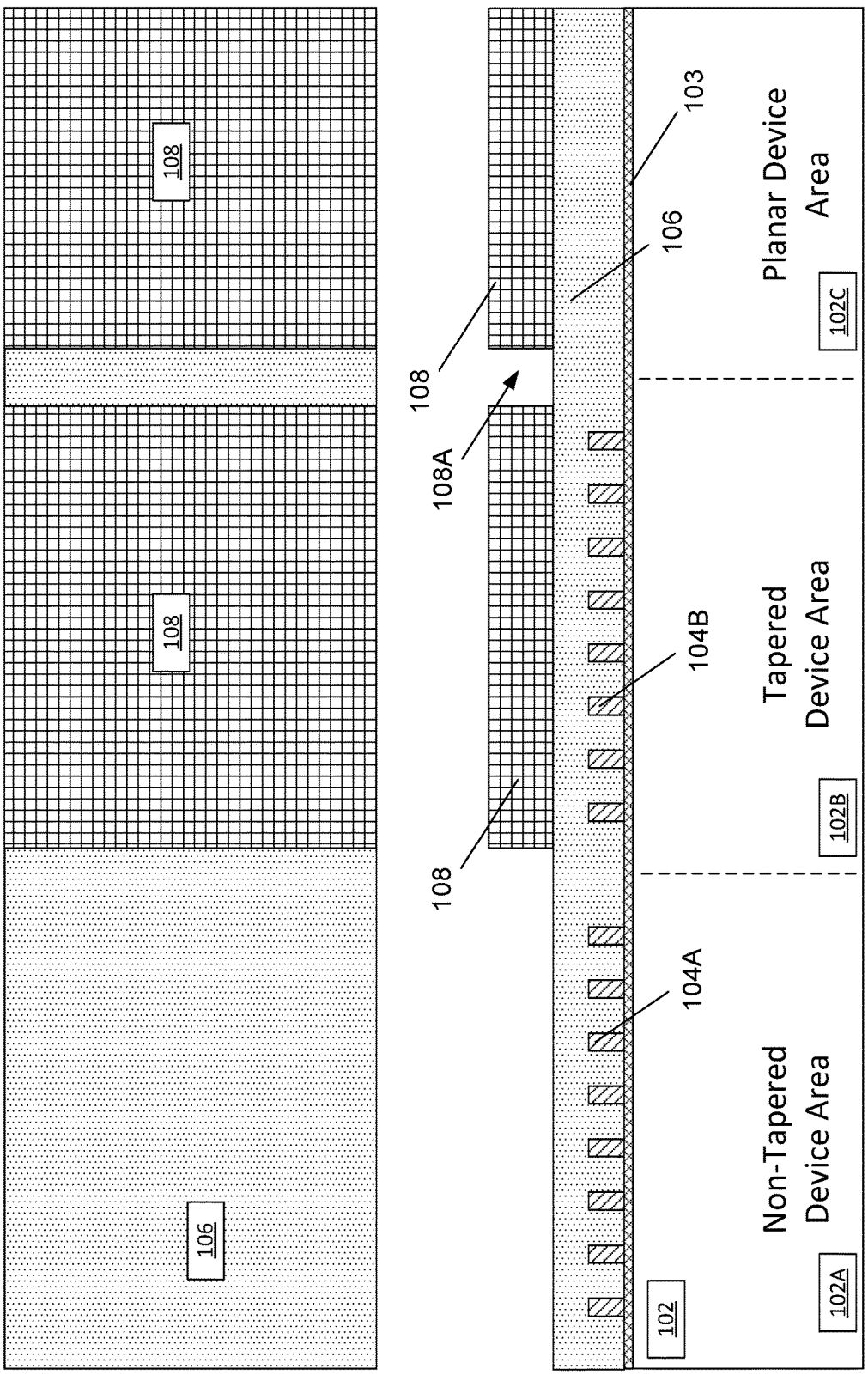
Figure 2D:
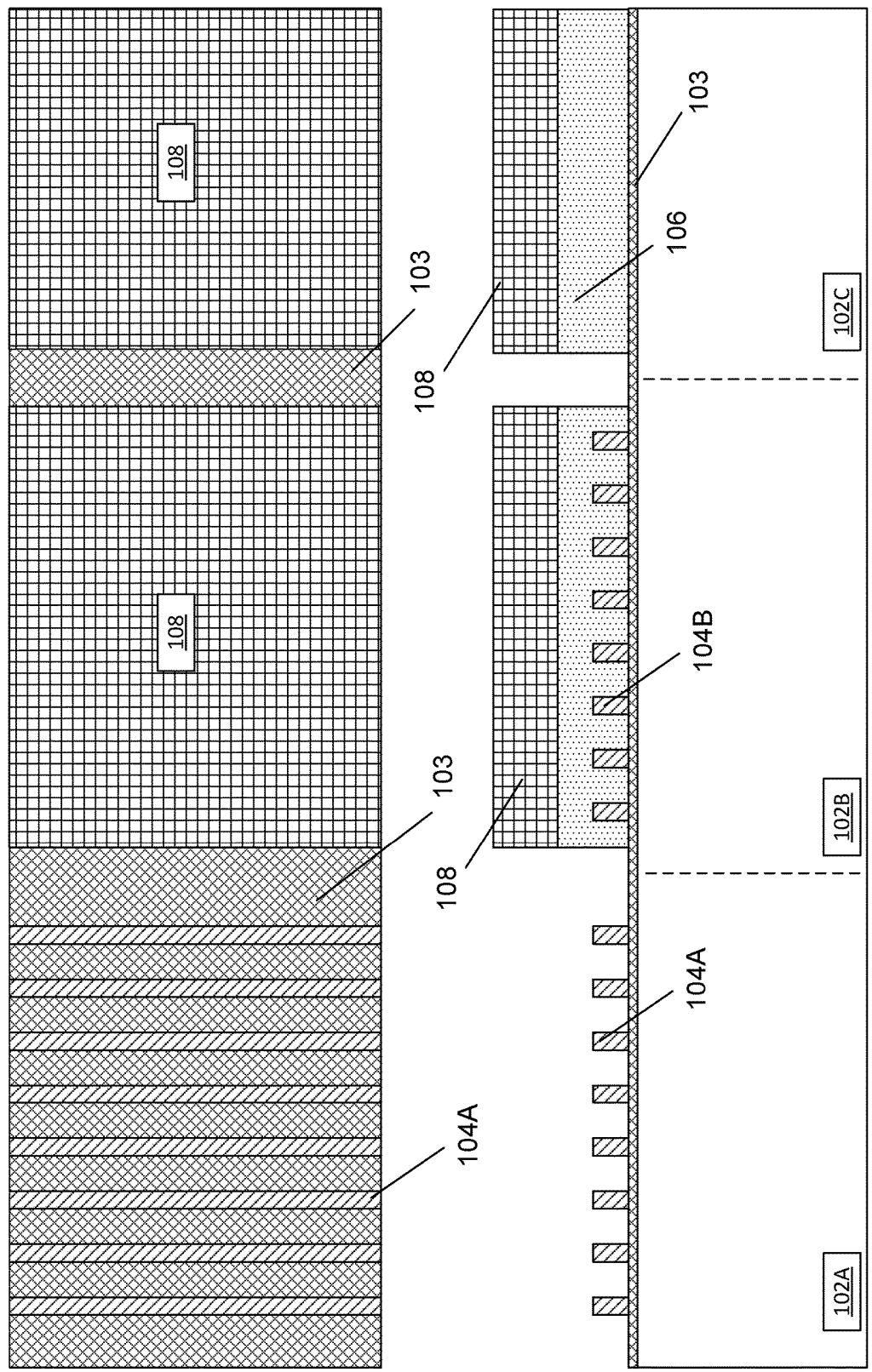
Figure 2E:
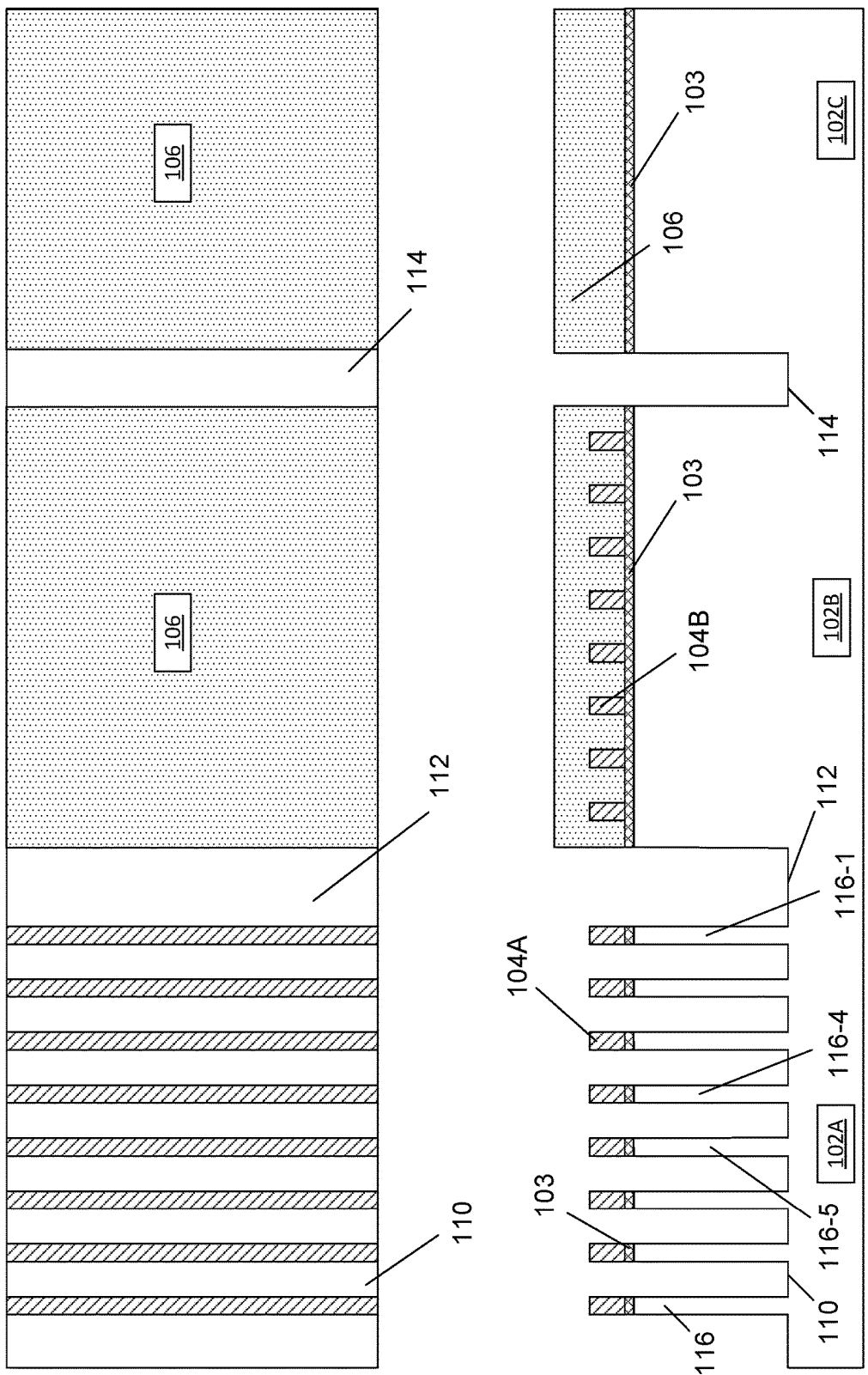
Figure 2F:
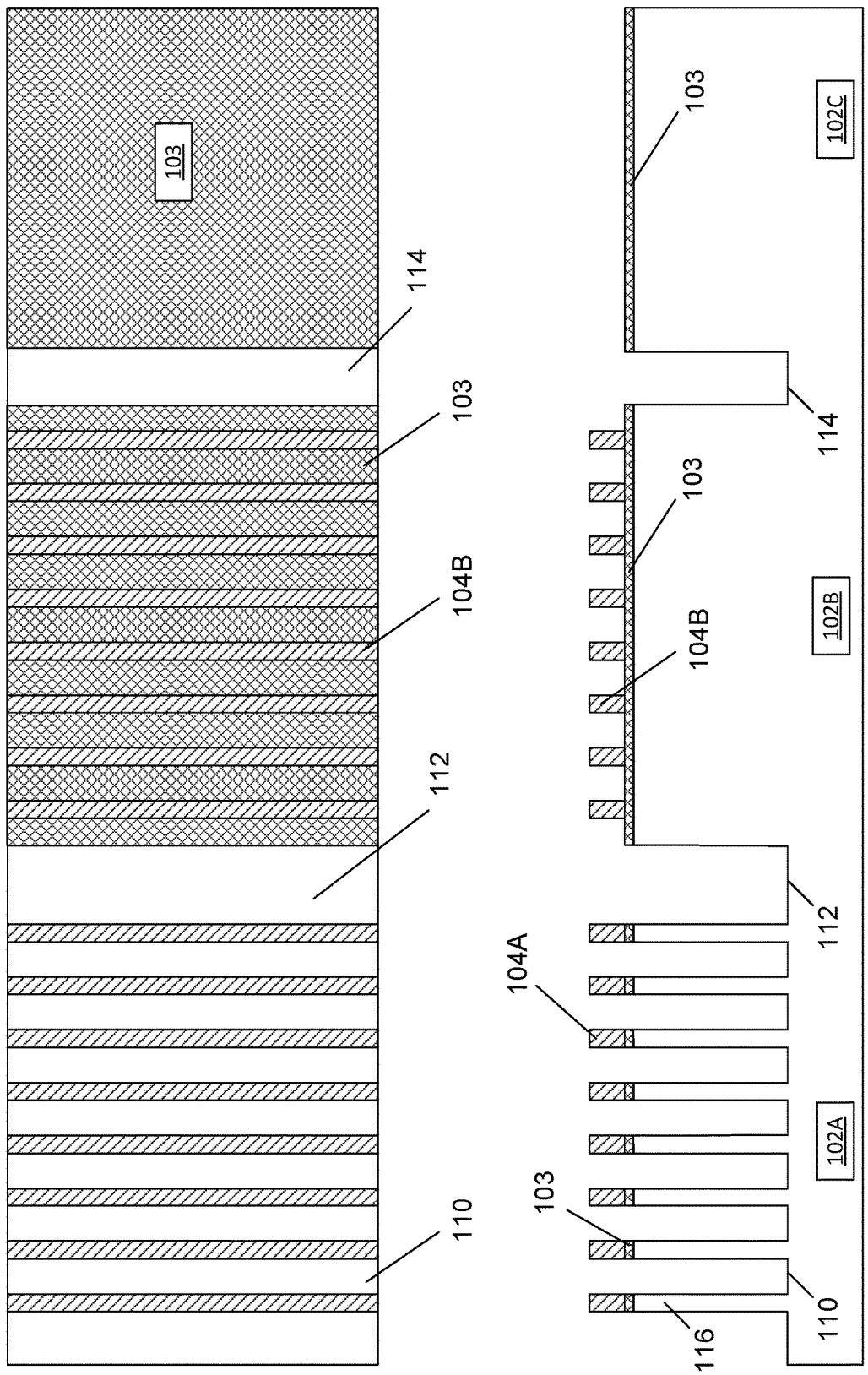
Figure 2G:
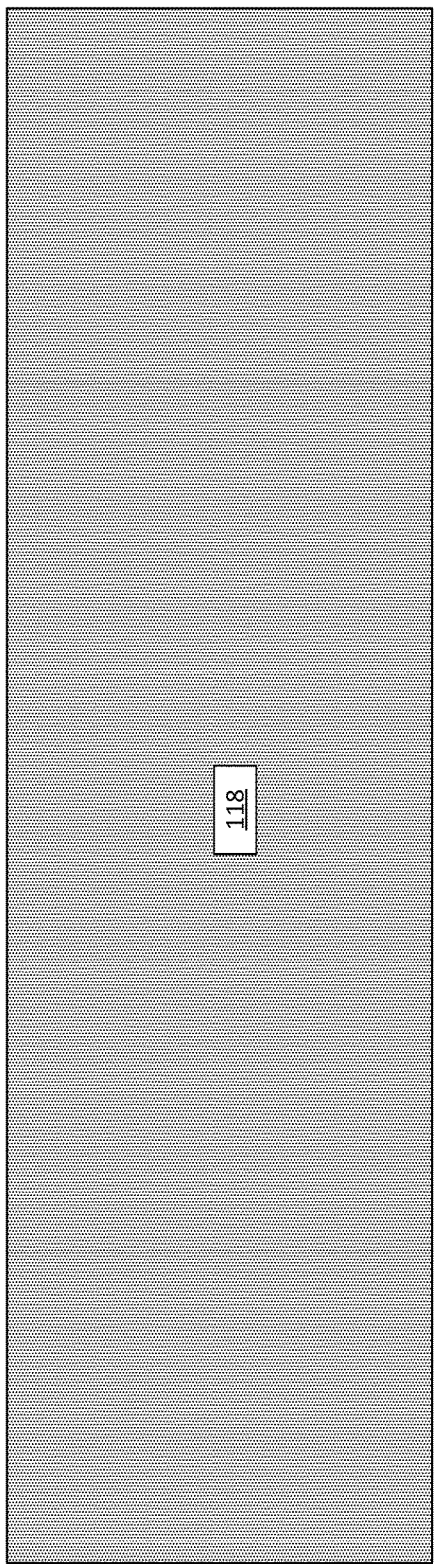
Figure 2G:
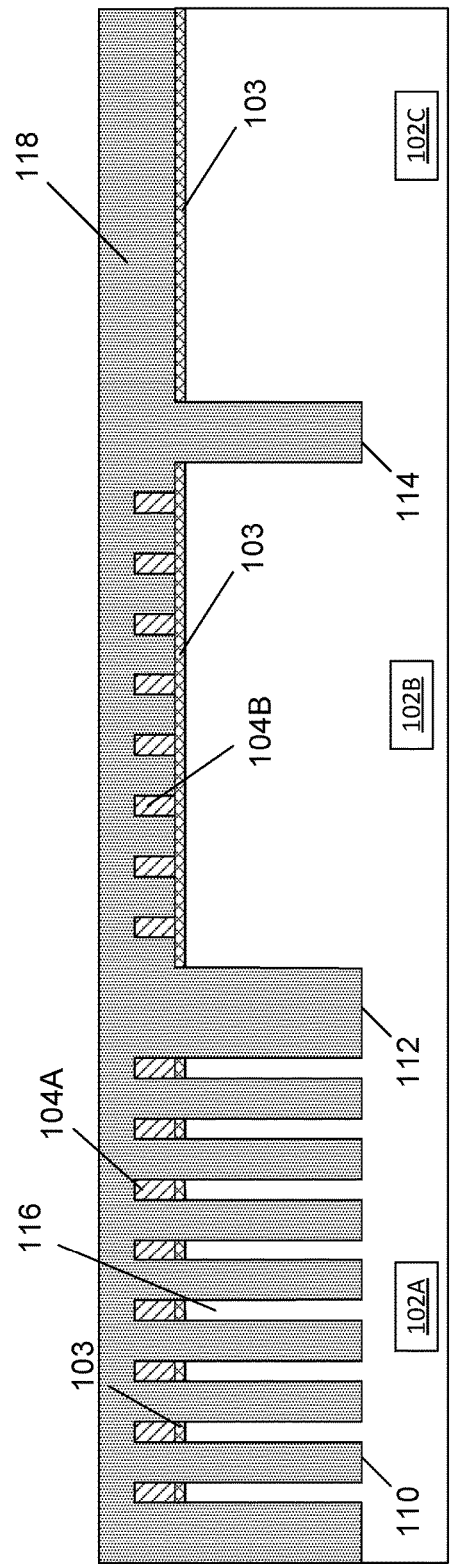
Figure 2H:
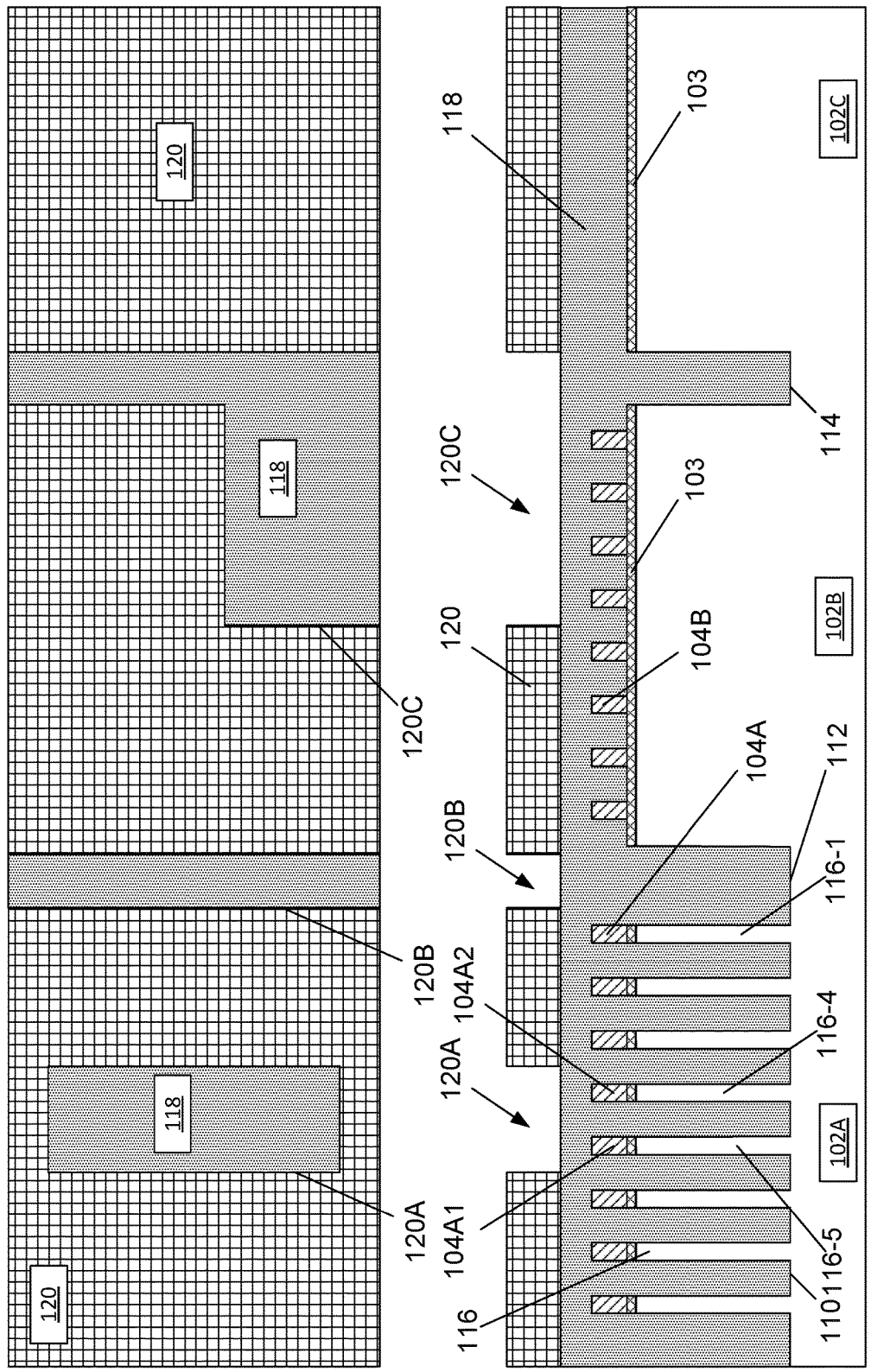
Figure 2I:
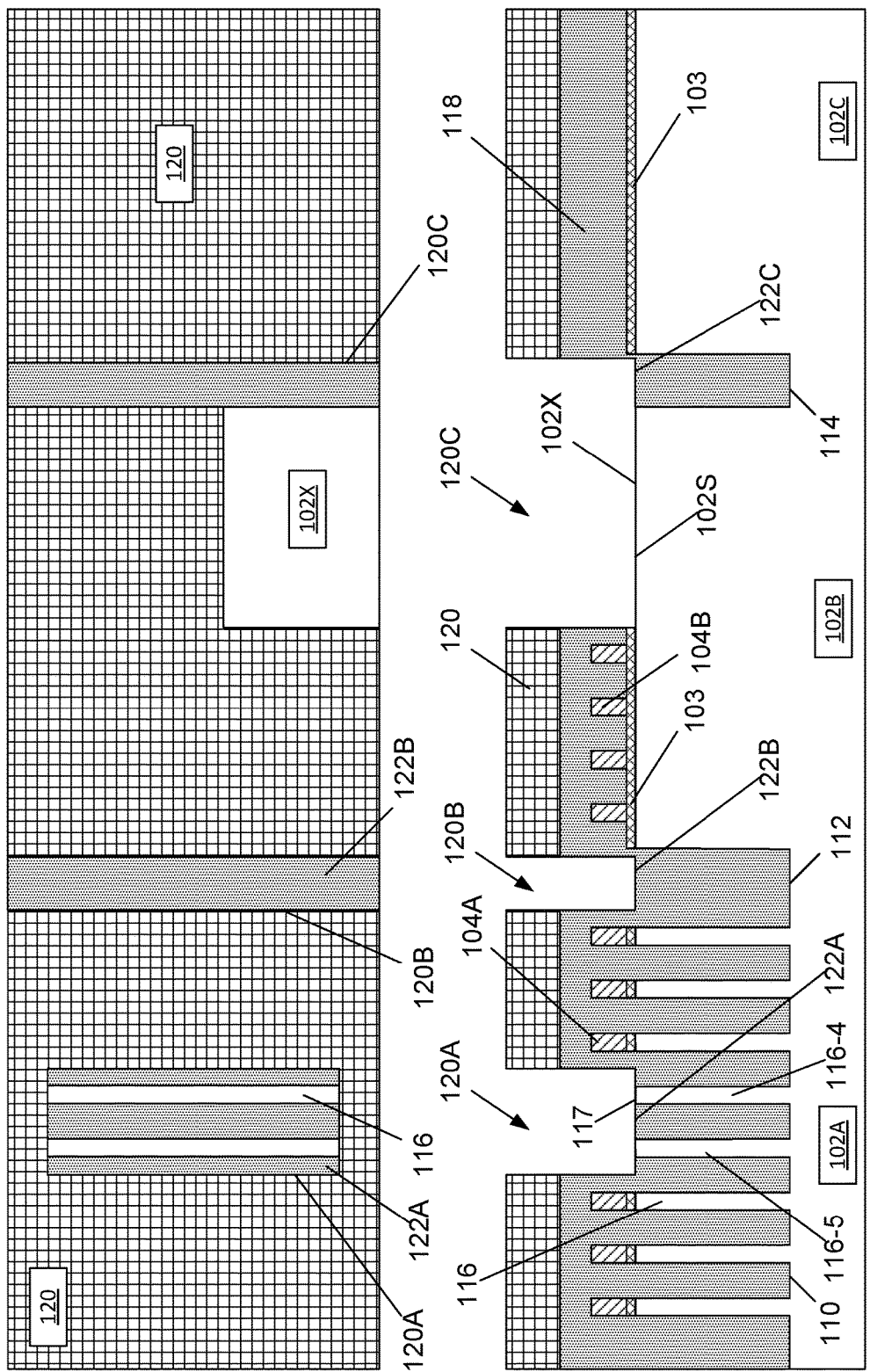
Figure 2J:
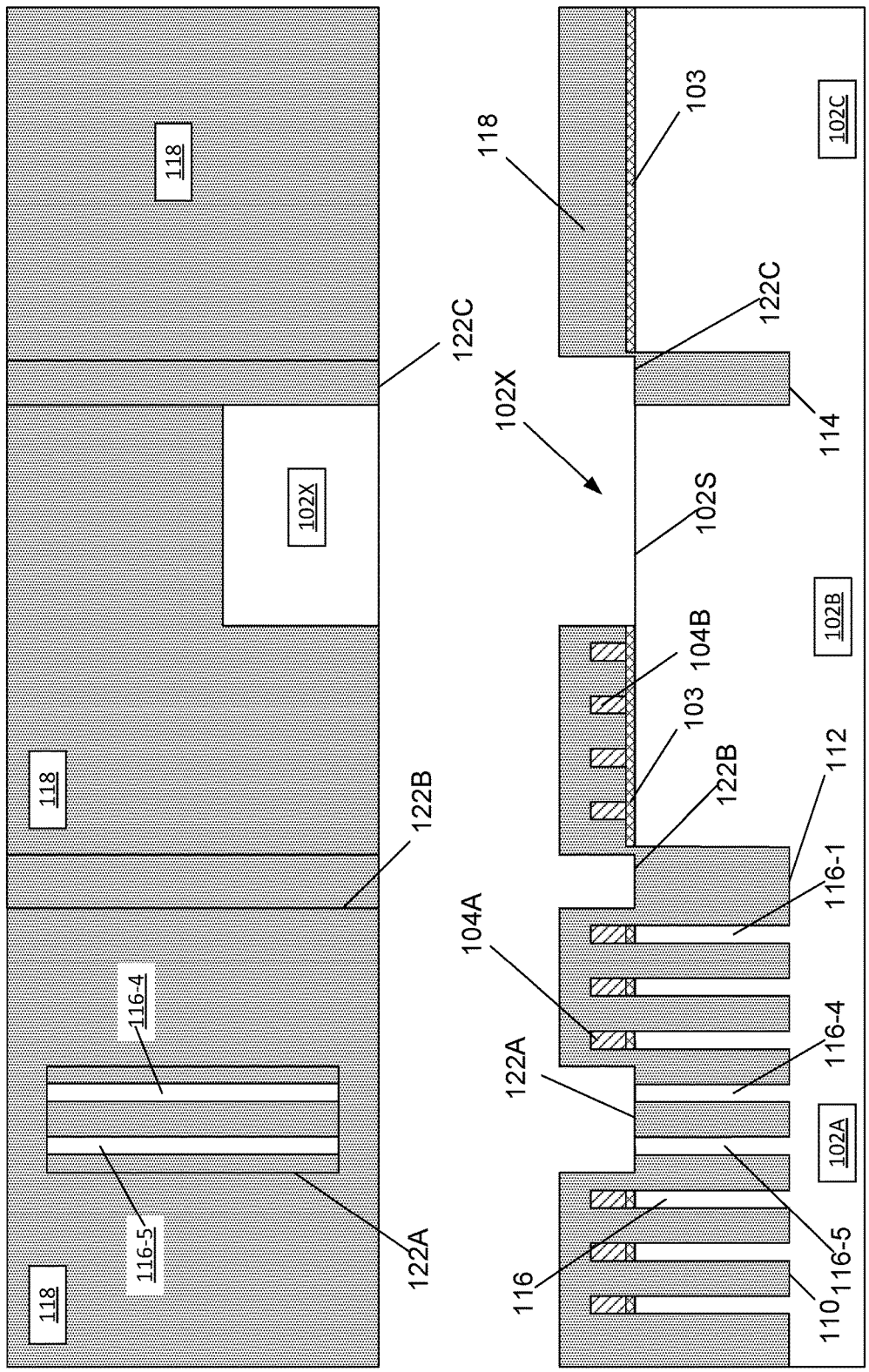
Figure 2K:
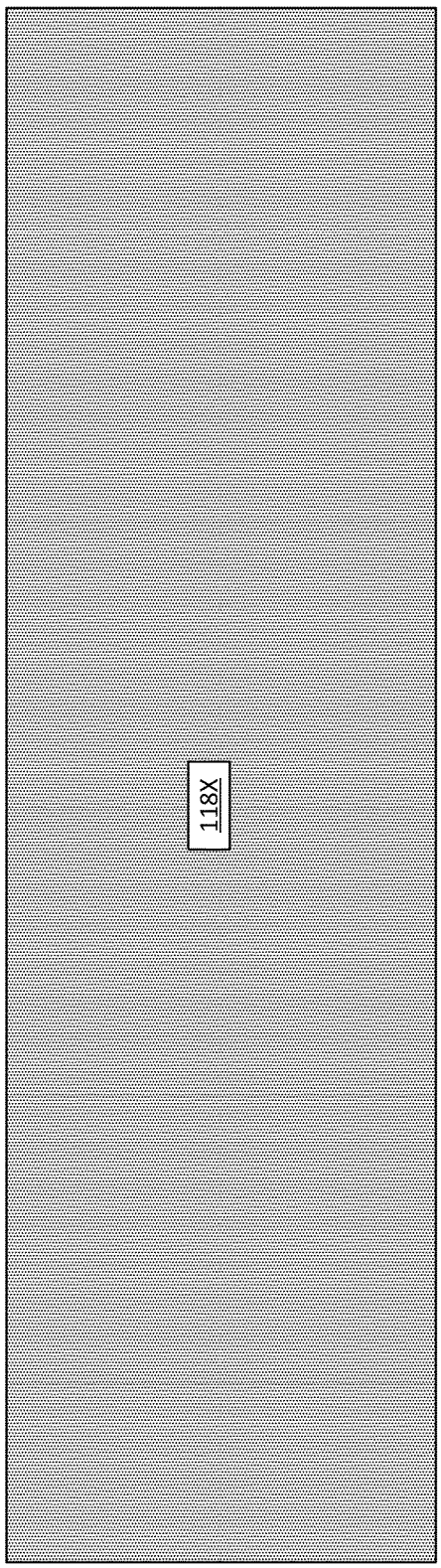
Figure 2K:
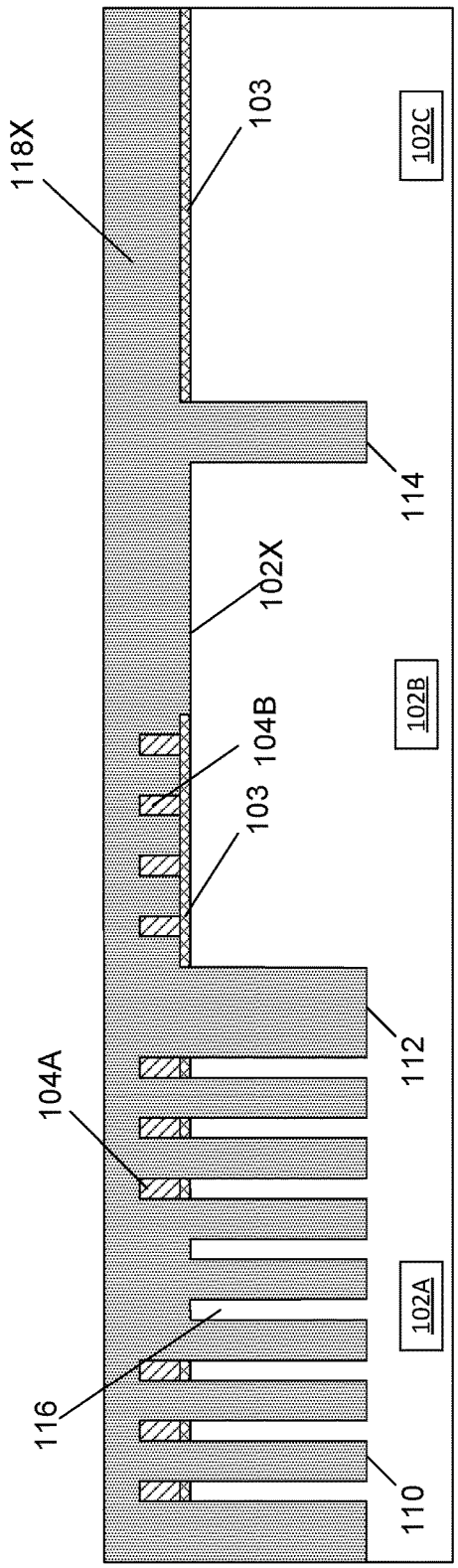
Figure 2M:
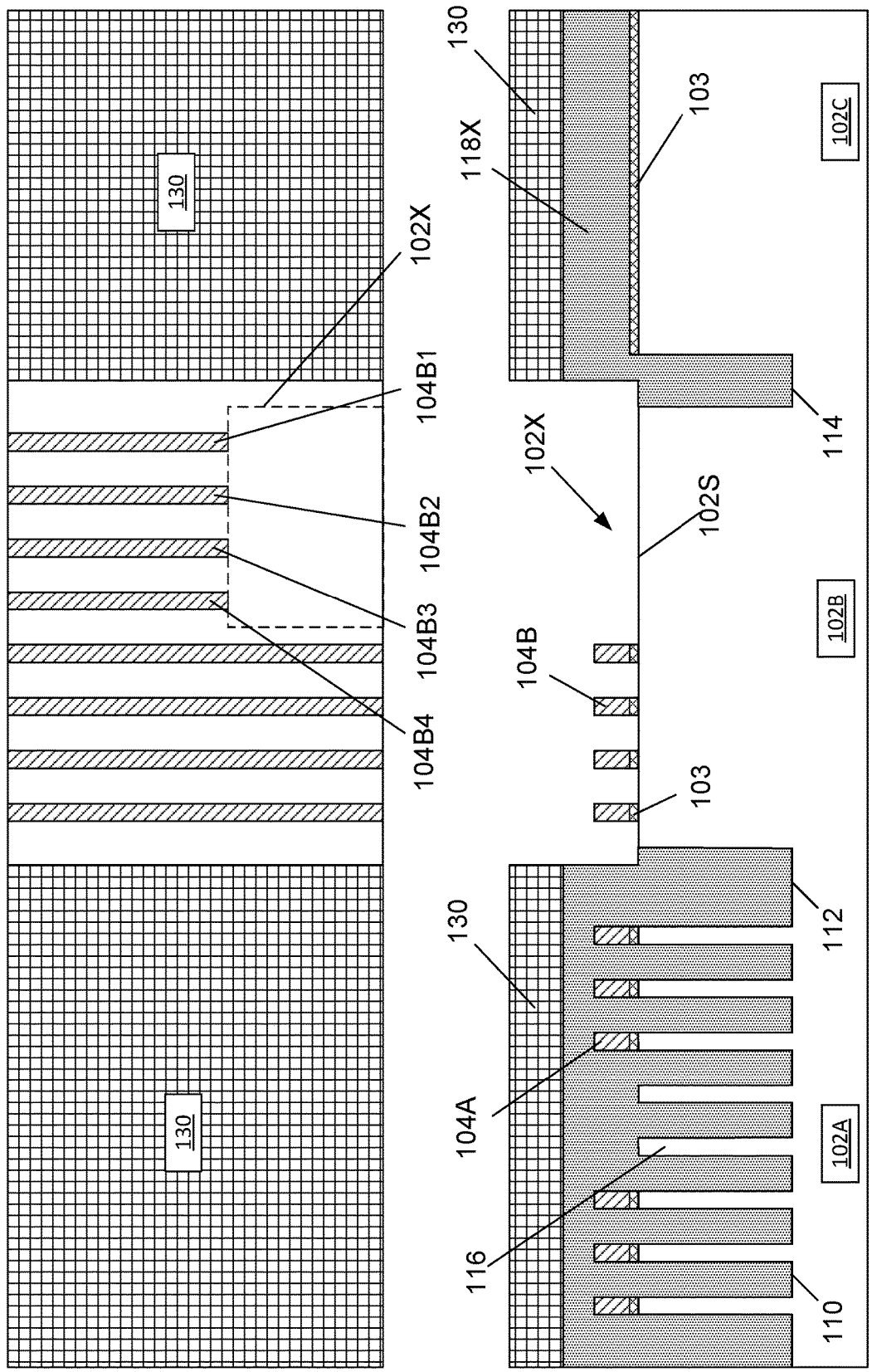
Figure 2N:
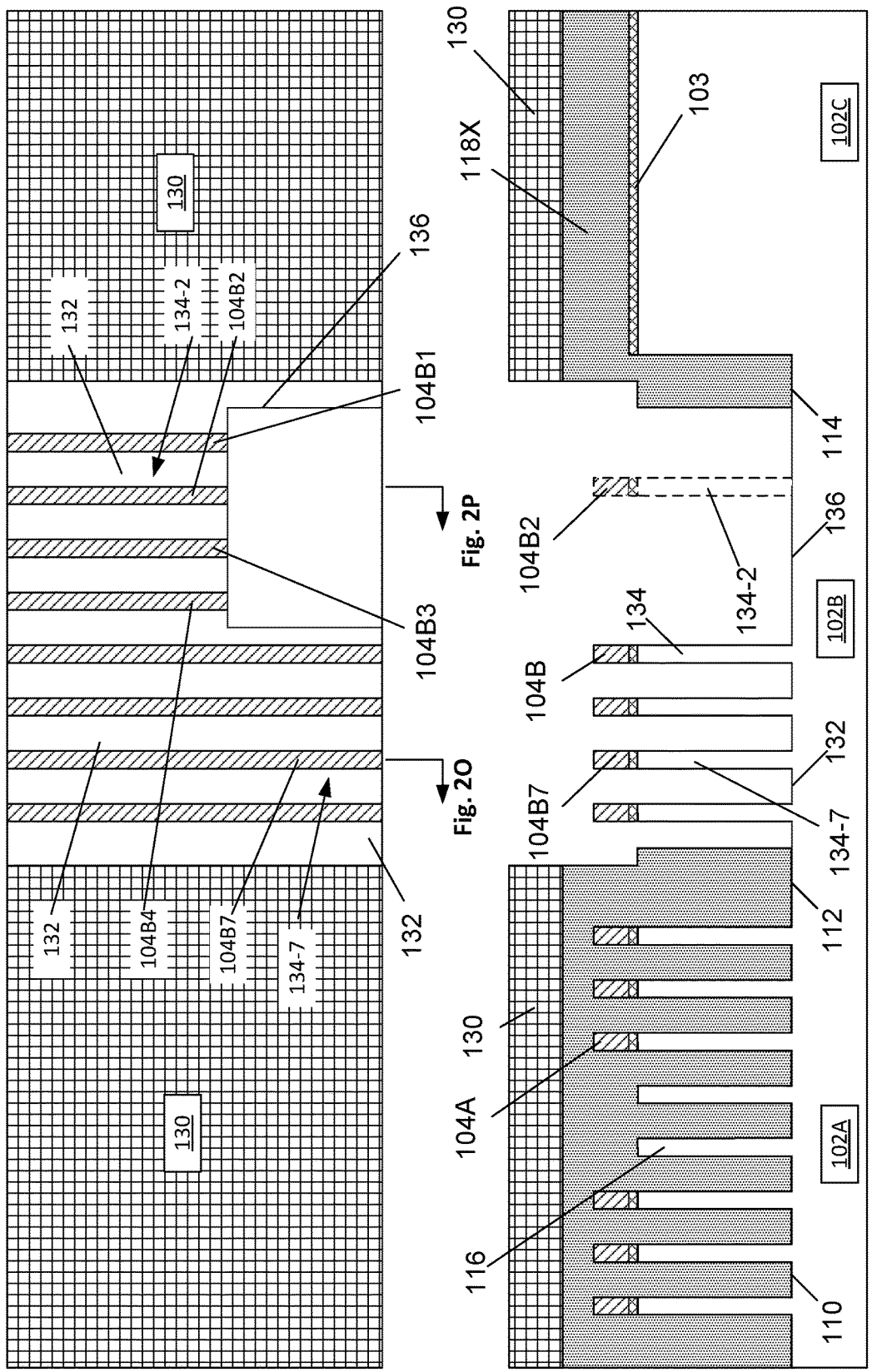
Figure 2S:
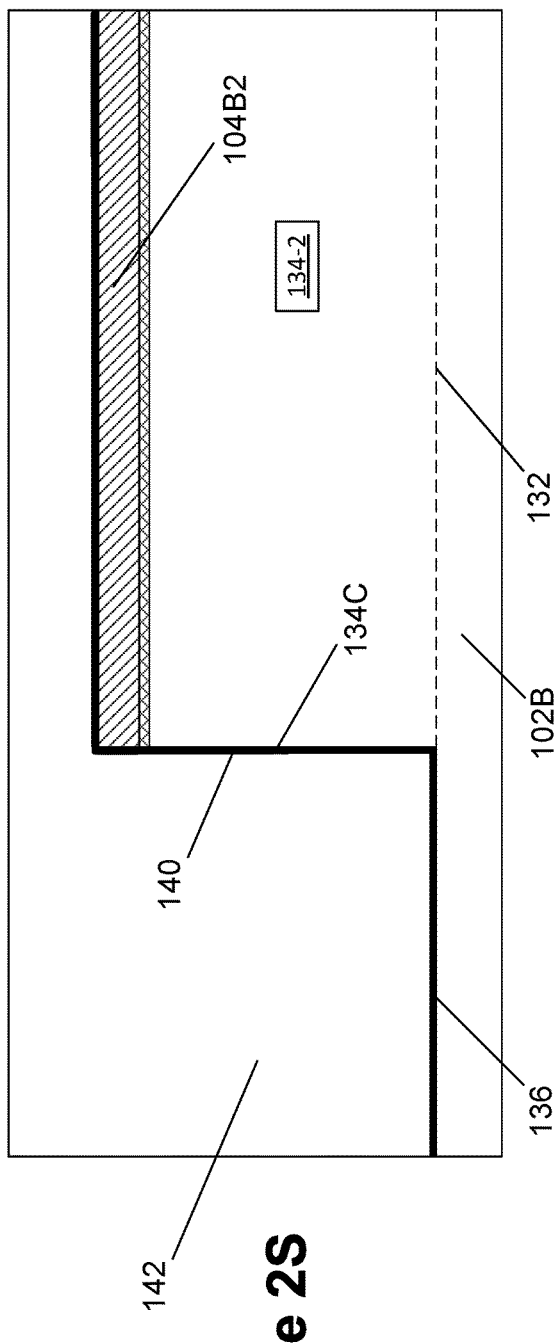
Figure 2R:
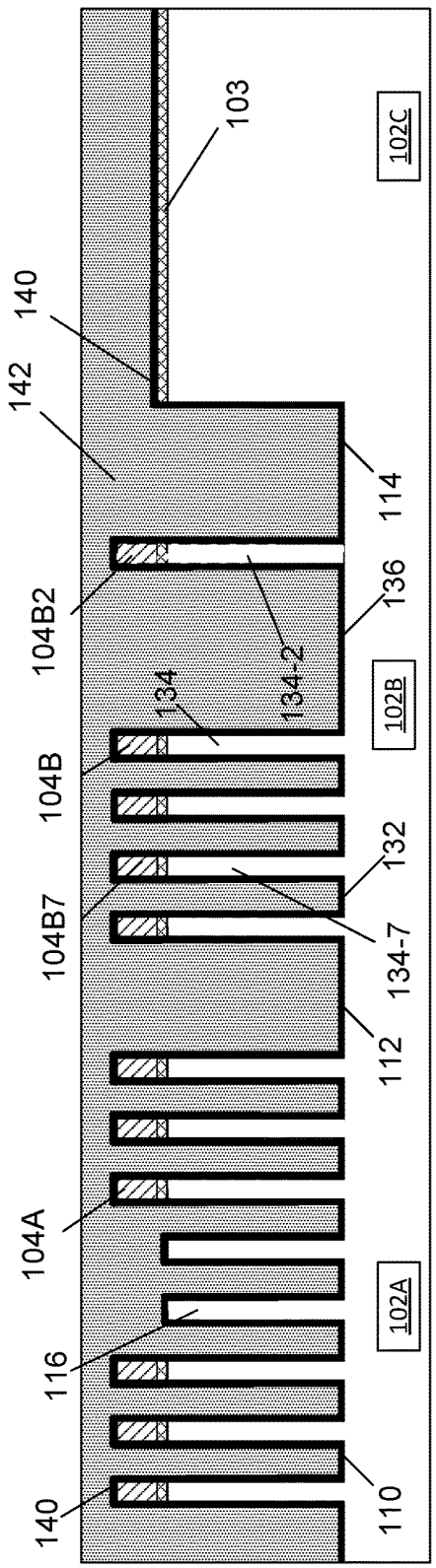
Figure 2T:
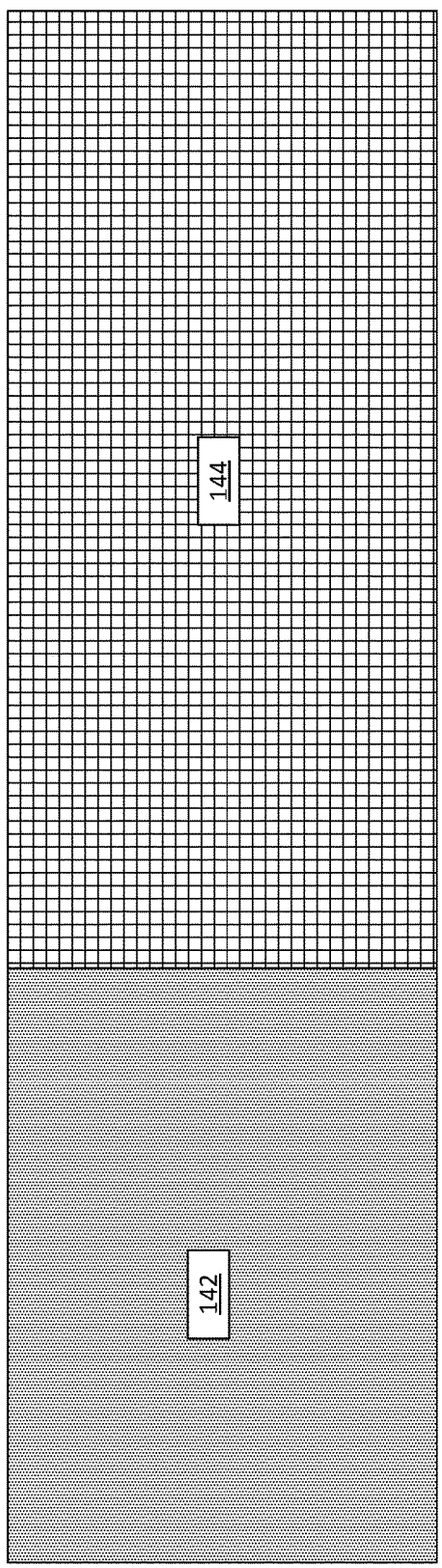
Figure 2T:
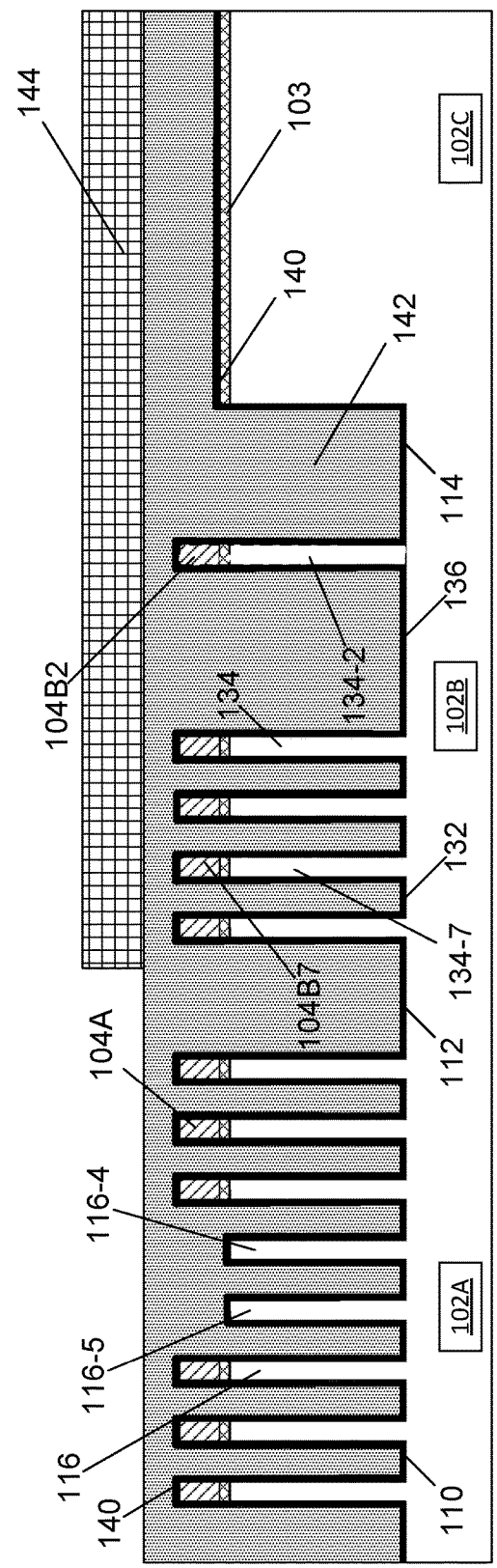
Figure 2Y:
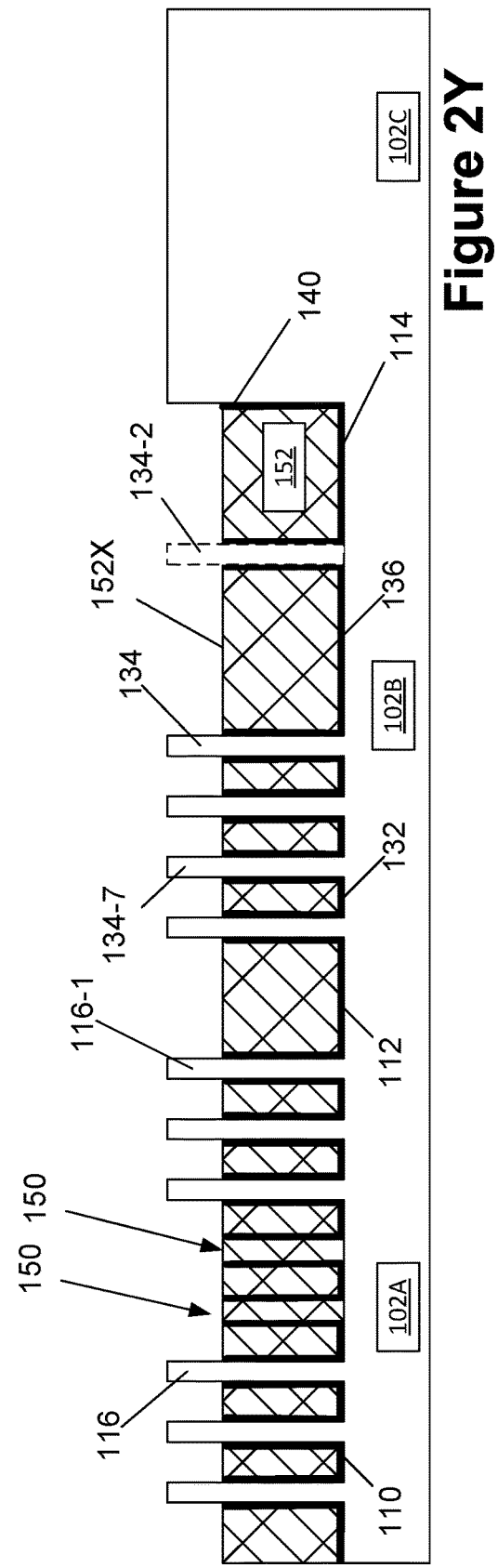
Figure 2Z:
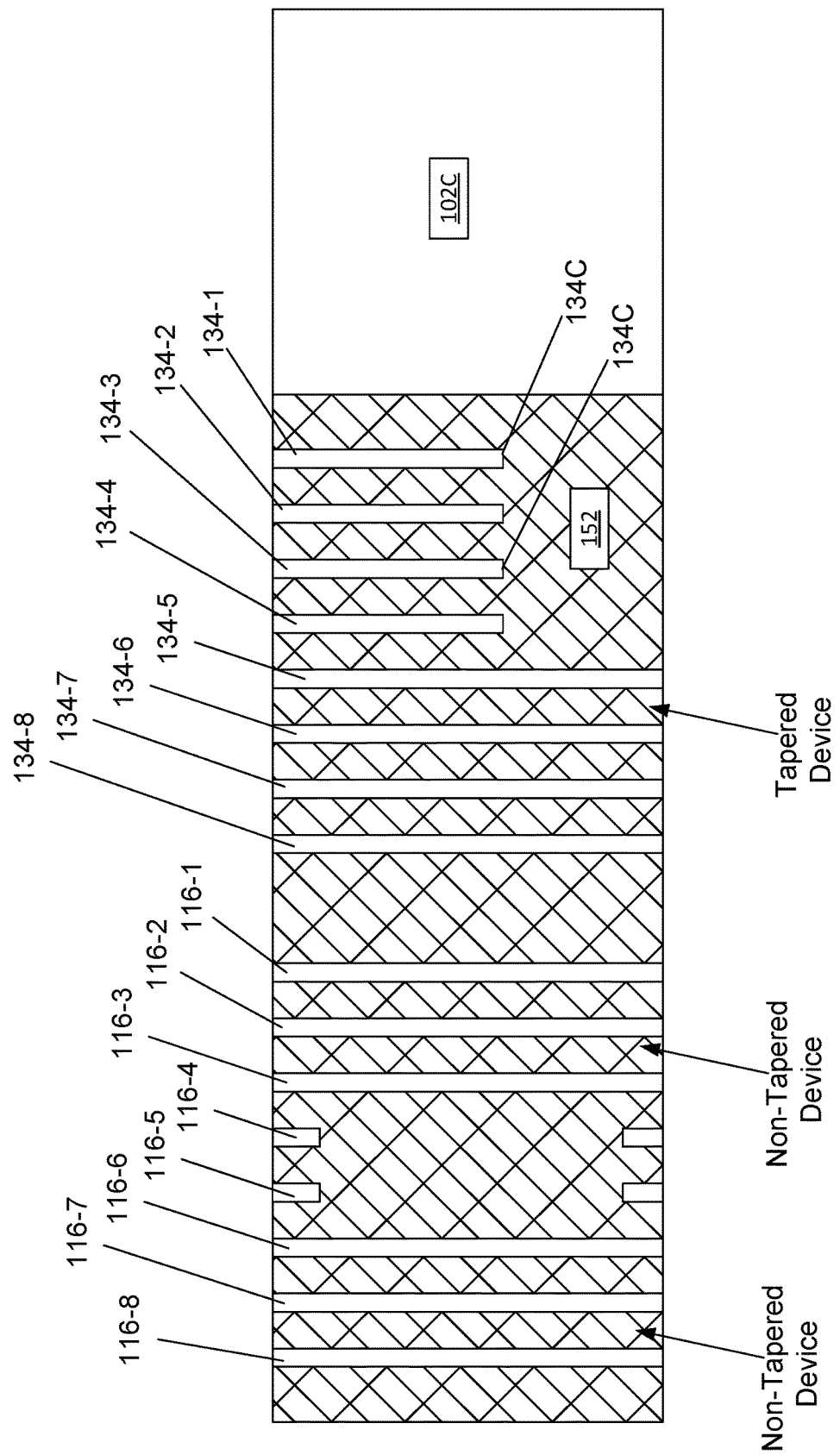

FIGS. 2A-2Z depict various hybrid fin cut etching processes that may be performed on integrated circuit products that include both tapered and non-tapered FinFET semiconductor devices. The illustrative product 100 will be formed in and above a semiconductor substrate 102. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be formed of silicon or silicon germanium or it may be made of materials other than silicon, such as germanium. Thus, the terms "substrate" or "semiconductor substrate" should be understood to cover all semiconducting materials and all forms of such materials. The substrate 102 may have different layers. When completed, the illustrative product 100 will include a non-tapered FinFET device that is formed in a non-tapered device area 102A of the substrate 102; a tapered FinFET device that is formed in a tapered device area 102B of the substrate 102; and a planar device that is formed in a planar device area 102C of the substrate 102. The areas 102A, 102B and 102C may be laterally adjacent one another (as depicted) or they may be spaced apart regions that are spread across the substrate 102. The present disclosure is directed to unique processes of cutting undesired portions of the fins for both the non-tapered and tapered FinFET devices. After the cutting of the fins as described herein, all of the devices may be manufactured using known processing techniques. In some application, the planar device area 102C may be omitted if the product does not include any planar devices. In many cases, the drawings contain a simplistic plan view of the cross-sectional views shown in the drawings. However, it may be the case that all of the features illustrated in the cross-sectional views are not replicated in the simplistic plan views.

FIG. 2A depicts the product 100 after a pad oxide layer 103 and a patterned fin-formation etch mask layer 104, e.g., a patterned hard mask layer, was formed above the substrate 102. The patterned fin-formation etch mask layer 104 is comprised of a plurality of line-type features 104A that correspond to fins that are to be formed in the non-tapered device area 102A of the substrate 102, and a plurality of line-type features 104B that correspond to fins that are to be formed in the tapered device area 102B of the substrate 102. The patterned fin-formation etch mask layer 104 is intended to be representative in nature as it may be comprised of a variety of materials, such as, for example, a photoresist material, silicon nitride, silicon oxynitride, etc. Moreover, the patterned fin-formation etch mask layer 104 may be comprised of multiple layers of material, such as, for example, a silicon nitride layer and a layer of silicon dioxide. The patterned fin-formation etch mask layer 104 may be formed by depositing the layer(s) of material that comprise the patterned fin-formation etch mask layer 104 and thereafter directly patterning the masking layer 104 using known photolithography and etching techniques. Alternatively, the patterned fin-formation etch mask layer 104 may be formed by using known sidewall image transfer techniques. Thus, the particular form and composition of the patterned fin-formation etch mask layer 104 and the manner in which it is made should not be considered a limitation of the present invention. In the depicted example, there are eight of the features 104A that correspond to the fins to be formed in the non-tapered device area 102A of the substrate 102 and eight of the features 104B that correspond to the fins that are to be formed in the tapered device area 102B of the substrate 102. Of course, any number of fins can be formed in the regions 102A, 102B. The lateral size and the pitch of the fins in the areas 102A, 102B may vary depending upon the particular application and these dimensions may or may not be the same in both of the areas 102A, 102B.

FIG. 2B illustrates the product 100 after a layer of material 106, such as a planarization layer like OPL, was formed across the entire substrate 102. The thickness of the layer of material 106 may vary depending upon the particular application.

FIG. 2C depicts the product 100 after a first patterned masking layer 108 was formed above the substrate 102. As depicted, the first patterned masking layer 108 covers substantially all of the tapered device area 102B of the substrate 102 and the planar device area 102C of the substrate 102, while exposing all of the non-tapered device area 102A of the substrate 102. The first patterned masking layer 108 also comprises an opening 108A between the tapered device area 102B of the substrate 102 and the planar device area 102C of the substrate 102. In one embodiment, the first patterned masking layer 108 may be a patterned layer of photoresist material that is formed using traditional photolithography tools and equipment.

FIG. 2D depicts the product 100 after an etching process was performed through the first patterned masking layer 108 to remove exposed portions of the layer of material 106 and thereby pattern the layer of material 106. As depicted, the etching process stops on the pad oxide layer 103.

FIG. 2E depicts the product 100 after several process operations were performed. First, the first patterned masking layer 108 was removed (although it need not be removed in all applications). Thereafter, a fin-formation etching process was performed through the exposed portions of the patterned fin-formation etch mask layer 104 above the non-tapered device area 102A of the substrate 102 and through the patterned layer of material 106. This process operation results in the definition of a plurality of fin-formation trenches 110 in the area 102A of the substrate 102 which define a plurality of fins 116 in the non-tapered device area 102A of the substrate 102. Performing the fin-formation etching process also results in the formation of a trench 112 in the substrate 102 between the non-tapered device area 102A and the tapered device area 102B, and the formation of a trench 114 in the substrate 102 between the tapered device area 102B and the planar device area 102C. In the example depicted herein, there are eight of the fins 116 formed in the non-tapered device area 102A of the substrate 102. For ease of reference, these fins have been numbered (from right to left) 116-1, . . . , 116-4, 116-5, . . . ).

With continuing reference to FIG. 2E, in the illustrative example depicted in the attached figures, the fin-formation trenches 110 and the fins 116 (as well as other fins that will be formed later in the process) are all depicted as being of a uniform size and shape. However, such uniformity in the size and shape of the fins 116 (and others) may not be required to practice at least some aspects of the inventions disclosed herein. In the example depicted herein, the fin-formation trenches 110 are depicted as having been formed by performing one or more anisotropic etching processes, but other etching processes may be used to form the trenches 110 and define the fins 116. In the depicted example, the fins 116 (and other fins to be performed later in the process described below) are simplistically depicted as have a substantially rectangular cross-sectional configuration for ease of explanation. However, in a real-world device, the fins 116 (and other fins) may be formed so as to have a tapered cross-sectional configuration (wider at the bottom of the fin than at the top of the fin). Thus, the size and configuration of the fin-formation trenches, e.g., the trenches 110, and the fins, e.g., the fins 116, and the manner in which they are made, should not be considered a limitation of the present invention.

FIG. 2F depicts the product 100 after the patterned the layer of material 106 was removed from above the substrate 102.

FIG. 2G illustrates the product 100 after a layer of material 118, such as a planarization layer like OPL, was formed across the entire substrate 102. The thickness of the layer of material 118 may vary depending upon the particular application.

FIG. 2H depicts the product 100 after a second patterned masking layer 120 was formed above the substrate 102. As noted above, if desired, two separate masking layers can be used at this point in the process flow if desired so as to avoid the corner rounding problem as discussed in the background section of this application. As depicted, the second patterned masking layer 120 covers substantially all of the planar device area 102C of the substrate 102, while exposing a portion of the area above the non-tapered device area 102A and a portion of the area above the tapered device area 102B. More specifically, the second patterned masking layer 120 comprises a substantially rectangular opening 120A that exposes an area above axial portions of the fins 116-4, 116-5 that will be removed from the group of fins 116 in the non-tapered device area 102A of the substrate 102 by performing a fin-cut-last process, as described more fully below. The second patterned masking layer 120 also comprises an opening 120C that exposes an area above the tapered device area 102B where portions of the axial length of certain of the features 104B of the patterned fin-formation etch mask layer 104 will be removed using a fin-cut-first process, as described more fully below. A portion of the opening 120C also exposes the area above the trench 114. Lastly, the second patterned masking layer 120 has an opening 120B that exposes an area above the trench 112. In one embodiment, the second patterned masking layer 120 may be a patterned layer of photoresist material that is formed using traditional photolithography tools and equipment.

FIG. 2I depicts the product 100 after one or more etching processes were performed through the second patterned masking layer 120 to remove some of the exposed portions of the layer of material 118 (and thereby pattern the layer of material 118) so as to define trenches 122A, 122B and 122C in the layer of material 118. Performing these one or more etching processes also results in the removal of portions of the axial length of the features 104B of the patterned fin-formation etch mask layer 104 and the pad oxide layer 103 in the area 102X of the tapered device area 102B (which thereby exposes the upper surface 102S of the substrate in the area 102X. More specifically, as will be more apparent when viewing FIG. 2M, performing this etching process results in the removal of portions of the axial length of the features 104B1, 104B2, 104B3 and 104B4 prior to the formation of any fins in the tapered device region 102B. As will be appreciated by those skilled in the art after a complete reading of the present application, this is a fins-cut-first process that is performed for the fins that will be formed in the tapered device region 102B. Performing the one or more etching processes also results in the removal of the portions of the features 104A1 and 104A2 (above the fins 116-5, 116-4, respectively) (see FIG. 2H) in the non-tapered device area 102A within the area defined by the opening 120A in the second patterned masking layer 120. Importantly, at the conclusion of these one or more etching processes, the upper surface 117 of the portions of the axial length of the fins 116-4, 116-5 that are desired to be removed are exposed. Exposing the surfaces 117 of the fins 116-4 and 116-5 facilitates the removal of the desired portions of these fins using a fin-cut-last process, as described more fully below. This process operation effectively results in the definition of a modified patterned fin-formation etch mask 104 where portions of the features 104A and portions of the features 104B have been removed.

FIG. 2J depicts the product 100 after the second patterned masking layer 120 was removed from above the substrate 102.

FIG. 2K depicts the product 100 after additional material of the layer of material 118, such as a planarization layer like OPL, was formed in the openings in the layer of material 118 shown in FIG. 2J. Thus, the layer has been re-identified with the reference number 118X. Alternatively, the layer of material 118 shown in FIG. 2J could simply be removed and a new layer of material 118 could be formed on the substrate 102 so as to arrive at the structure depicted in FIG. 2K.

FIG. 2L depicts the product 100 after a third patterned masking layer 130 was formed above the substrate 102. As depicted, the third patterned masking layer 130 covers substantially all of the non-tapered device area 102A of the substrate 102 and the planar device area 102C of the substrate 102. The third patterned masking layer 130 comprises an opening 130A that exposes an area above all of the tapered device area 102B of the substrate 102. In one embodiment, the third patterned masking layer 130 may be a patterned layer of photoresist material that is formed using traditional photolithography tools and equipment.

FIG. 2M depicts the product 100 after one or more etching processes were performed through the third patterned masking layer 130 to remove exposed portions of the layer of material 118X and thereby pattern the layer of material 118X. As depicted, the one or more etching processes also remove remaining exposed portions of the pad oxide layer 103 in the area 102B of the substrate 102. As depicted, the removal of the portions of the material 118X reveals the features 104B1, 104B2, 104B3 and 104B4 that were cut using a fin-cut-first process as shown in Figure I.

The next set of process operations will be described with reference to FIGS. 2N-2P. These drawings depict the product 100 after several process operations were performed. FIGS. 2O and 2P are cross-sectional views taken wherein indicated in the plan view shown in FIG. 2N (with layers above the patterned fin-formation masking layer 104 removed in FIGS. 2O-2P). First, a second a fin-formation etching process was performed through the third patterned masking layer 130, through the patterned layer of material 118X and though the exposed portions of the patterned fin-formation etch mask layer 104 positioned above the tapered device area 102B of the substrate 102. If desired, the third patterned masking layer 130 may be removed prior to performing the second fin-formation etching process. This second fin-formation etching process was performed while the non-tapered device area 102A is masked. Performing the second fin-formation etching process operation results in the definition of a plurality of fin-formation trenches 132 in the tapered device area 102B of the substrate 102 which define a plurality of fins 134 in the tapered device area 102B of the substrate 102. Performing the second fin-formation etching process also results in the formation of a trench 136 in the substrate 102 in an area of the tapered device area 102B where portions of the features 104B of the patterned fin-formation etch mask layer 104 were removed. In the example depicted herein, there are eight of the fins 134 formed in the tapered device area 102B of the substrate 102. For ease of reference, these fins 134 have been numbered (from right to left) 134-1 . . . 134-8). In the depicted example, by use of the fin-cut-first process in the tapered device region 102B, portions of what would have been fins 134-1, 134-2, 134-3 and 134-4 are not defined in the substrate 102 due to the removal of portions of the features 104B1-104B4. The fin 134-2 is depicted in dashed lines in the bottom drawing in FIG. 2N, because it is not technically in the drawing plane depicted in the cross-sectional view in FIG. 2N. That is, it is only depicted for reference purposes only. FIG. 2O is a cross-sectional view taken through the long axis of the fin 134-7, while FIG. 2P is a cross-sectional view taken through the long axis of the fin 134-2. As depicted, the fin 134-2 has a cut end surface 134C that was created when the trench 136 was formed in the substrate 102. Note that the comments above with respect to the formation of the fins 116 apply equally to the formation of the fins 134.

FIG. 2Q depicts the product 100 after several process operations were performed. First, if not removed previously, the third patterned masking layer 130 was removed, followed by the removal of the layer of material 118X. Thereafter, a liner layer 140 was formed across the substrate 102 by performing a conformal deposition process. The liner layer 140 may be comprised of a variety of materials such as, for example, silicon dioxide, silicon nitride, etc. In general, the liner layer 140 may be comprised of one or more materials that exhibit some degree of etch selectivity with respect to the material of the patterned fin-formation etch mask 104. In one embodiment, the liner layer 140 may be comprised of an inner layer of silicon dioxide and an outer layer of silicon nitride. The thickness of the liner layer 140 may vary depending upon the particular application.

FIGS. 2R-2S depict the product 100 after a layer of material 142, such as a planarization layer like OPL, was formed across the entire substrate 102. As shown in FIG. 2S (which is a cross-sectional view taken through the long axis of the fin 134-2), the layer of material overfills the trench 136 and covers the cut ends 134C of the four fins 134-1, 134-2, 134-3 and 134-4. The thickness of the layer of material 142 may vary depending upon the particular application.

FIG. 2T depicts the product 100 after a fourth patterned masking layer 144 was formed above the substrate 102. As depicted, the fourth patterned masking layer 144 covers substantially all of the tapered device area 102B of the substrate 102 and the planar device area 102C of the substrate 102. However, the fourth patterned masking layer 144 is patterned so as to expose an area above all of the non-tapered device area 102A of the substrate 102. In one embodiment, the fourth patterned masking layer 144 may be a patterned layer of photoresist material that is formed using traditional photolithography tools and equipment.

FIG. 2U depicts the product 100 after a timed recess etching process was performed through the fourth patterned masking layer 144 to remove portions of the layer of material 142 in the non-tapered region 102A of the product. The layer of material 142 is recessed such that its recessed upper surface 142X is below the upper surface 116S of the fins 116. The recessing of the layer of material 142 exposes upper portions of the liner layer 140 in the non-tapered region 102A of the product 100.

FIG. 2V depicts the product 100 after a timed etching process was performed to remove portions of the liner layer 140. Performing this etching process exposes the upper surfaces 116S of the fins 116-4 and 116-5.

FIG. 2W depicts the product 100 after a timed etching process was performed to remove the exposed portions of the fins 116-4 and 116-5 in the non-tapered region 102A of the product 100 so as to define removed fin cavities 150.

After a complete reading of the present application, those skilled in the art will appreciate that this is part of a fins-cut-last process that is performed on the fins 116 in the non-tapered region 102A of the product 100. In some cases, all or part of the liner layer 140 adjacent the fins 116-4 and 116-5 may be removed as well, although that situation is not depicted in the drawings.

FIG. 2X depicts the product 100 after several process operations were performed. First, if not removed previously, the fourth patterned masking layer 144 was removed followed by the removal of the layer of material 142. Thereafter, a layer of insulating material 152 was formed across the substrate 102 by performing a blanket deposition process. The layer of insulating material 152 may be comprised of a variety of material such as, for example, silicon dioxide, etc.

FIG. 2Y depicts the product 100 after several process operations were performed. First, a CMP process was performed to planarize the upper surface of the layer of insulating material 152 with the upper surface of the fins 116 and 134 and the upper surface of the planar device region 120C. This CMP process results in the removal of portions of the liner layer 140, the remaining features of the patterned fin formation etch mask 104 and the pad oxide layer 103 above the planar device region 102C. Next, a timed recess etching process was performed on the layer of insulating material 152 such that its recessed upper surface 152X is at a level that exposes the final desired height of the fins 116 and 134 in both of the regions 102A and 102B. Then, a timed etching process was performed to remove any remaining portions of the liner layer 140 that might still be positioned on sidewalls of the fins 116, 134. Those skilled in the art will appreciate that other process flows could also be performed to reach the structure depicted in FIG. 2Y. For example, the CMP process could be performed so as to stop on the upper surface of the patterned fin-formation etch mask 104 and thereafter several etching processes could be performed to remove the mask layer 104, recess the layer of material 152 and remove the desired portions of the liner layer 140.

FIG. 2Z is a simplistic plan view of the product 100 after the completion of the process operations described above with respect to FIG. 2Y (with the liner layer 140 being omitted in FIG. 2Z). As depicted, portions of the fins 116-4 and 116-5 were removed from the non-tapered device region 102A by performing a modified fin-cut-last process. On the other hand, portions of what would have been fins 134-1, 134-2, 134-3 and 134-4 were not formed in the tapered device region 102B due to the removal of portions of the features 104B of the patterned fin-formation etch mask 104 by performing a fin-cut-first process. Also note that, as depicted in FIG. 2W, an isotropic etching process can be performed to remove the desired portions of the fins 116-4 and 116-5 in the non-tapered device region 102A so as to insure complete removal of the desired portions of those fins and avoid undesirable remnants of those fins, i.e., to avoid the fin spiking problem discussed in the background section of this application. Also note that, as shown in FIG. 2S, the cut ends 134C of the fins 134-1, 134-2, 134-3 and 134-4 in the tapered device region 102B are fully protected by the layer of material 142 during the isotropic etching process performed in FIG. 2W to remove the desired portions of the fins 116-4 and 116-5 in the non-tapered device region 102A. In the example depicted herein, a fin-cut-first process is performed in the region 102B followed by performing the fin-cut-last process in the region 102A. However, as will be recognized by those skilled in the art after a complete reading of the present invention, the fin-cut-last process could be performed in the region 102A prior to performing the fin-cut-first process in the device region 102B. Thus, the presently disclosed inventions should not be considered to be limited to the precise order of the steps depicted in the illustrative process flow disclosed herein.

At the point of fabrication depicted in FIGS. 2Y-2Z traditional manufacturing operations may be performed to complete the formation of the product 100. For example, gate structures (not shown) for the FinFET devices in regions 102A, 102B and planar devices in the region 102C may be formed using either gate-first or gate-last manufacturing techniques. Additionally, various source/drain and gate contact structures may be formed on the device, various metallization layers may be formed above the substrate 102 for the product 100 using known processing techniques, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A method of forming an integrated circuit product on a semiconductor substrate, the product comprising a non-tapered FinFET device formed in a first region of said substrate and a tapered FinFET device formed in a second region of said substrate, the method comprising:
  while masking said second region, forming a first plurality of fins for said non-tapered FinFET device in said first region by performing a fin-cut-last process that comprises:
    initially forming said first plurality of fins in said first region; and
    performing at least one first etch process to remove a portion of at least a first fin of said initially formed first plurality of fins without removing any portions of at least a second fin of said initially formed first plurality of fins during said at least one first etch process; and
  while masking said first region, forming a second plurality of fins for said tapered FinFET device in said second region by performing a fin-cut-first process that comprises:
    forming a patterned fin-formation etch mask layer comprising a plurality of line-type fin-formation features above said second region;
    modifying said patterned fin-formation etch mask layer by removing a portion of at least a first feature of said plurality of line-type fin-formation features of said patterned fin-formation etch mask layer without removing any portions of at least a second feature of said plurality of line-type fin-formation features; and performing a second etch process through said modified patterned fin-formation etch mask to define said second plurality of fins for said tapered FinFET device.

2. The method of claim 1, wherein the step of performing said second etch process through said modified patterned fin-formation etch mask to define said second plurality of fins for said tapered FinFET device is performed prior to the step of removing said portion of said at least one of said previously formed first plurality of fins.

3. The method of claim 1, wherein initially forming said first plurality of fins in said first region comprises performing at least one anisotropic etching process to initially form said first plurality of fins in said first region.

4. The method of claim 3, wherein performing said at least said one first etch process to remove said portion of said at least said first fin of said initially formed first plurality of fins comprises performing an isotropic etching process to remove said portion of said at least said first fin of said initially formed first plurality of fins.

5. The method of claim 1, wherein performing said second etch process through said modified patterned fin-formation etch mask to define said second plurality of fins for said tapered FinFET device comprises performing at least one anisotropic etching process through said modified patterned fin-formation etch mask to define said second plurality of fins for said tapered FinFET device.

6. The method of claim 1, wherein prior to forming said first plurality of fins for said non-tapered FinFET device in said first region, the method comprises forming said patterned fin-formation etch mask layer above said first and second regions.

7. The method of claim 1, wherein said non-tapered FinFET device is formed above a substantially rectangular active area defined in said substrate and said tapered FinFET device is formed above a substantially non-rectangular active area defined in said substrate.

8. The method of claim 1, wherein performing said second etch process through said modified patterned fin-formation etch mask to define said second plurality of fins for said tapered FinFET device results in at least some of said second plurality of fins having cut edges.

9. A method of forming an integrated circuit product on a semiconductor substrate, the product comprising a non-tapered FinFET device formed in a first region of said substrate and a tapered FinFET device formed in a second region of said substrate, the method comprising:
forming a patterned fin-formation etch mask layer above said first and second regions of said substrate;
while masking said patterned fin-formation etch mask layer in said second region, performing an anisotropic etching process through said patterned fin-formation etch mask layer to form a first plurality of fins in said first region;
after forming said first plurality of fins, removing a portion of at least one of a plurality of features of said patterned fin-formation etch mask layer that are positioned above said second region;
after removing said portion of said at least one of said plurality of features of said patterned fin-formation etch mask layer, and while masking said patterned fin-formation etch mask layer in said first region, performing an anisotropic etching process through said patterned fin-formation etch mask layer to form a second plurality of fins in said second region; and
after forming said second plurality of fins, forming a masking layer that covers said patterned fin-formation etch mask layer in said second region and thereafter performing an isotropic etching process through said patterned fin-formation etch mask layer to remove at least a portion of at least one of said first plurality of fins in said first region.

10. The method of claim 9, wherein removing said portion of said at least one of said plurality of features of said patterned fin-formation etch mask layer that are positioned above said second region comprises performing an etching process to remove said portion of said at least one of said plurality of features of said patterned fin-formation etch mask layer that are positioned above said second region and to remove a portion of at least one of a plurality of features of said patterned fin-formation etch mask layer that are positioned above said first region so as to thereby expose at least a portion of an upper surface of at least one of said first plurality of fins in said first region.

11. The method of claim 9, wherein performing said anisotropic etching process through said patterned fin-formation etch mask layer to form said second plurality of fins for said tapered FinFET device results in at least some of said second plurality of fins having cut edges.

12. The method of claim 11, wherein forming said masking layer that covers said patterned fin-formation etch mask layer comprises forming said masking layer that covers said patterned fin-formation etch mask layer and said cut edges of said at least some of said second plurality of fins.

13. A method of forming an integrated circuit product on a semiconductor substrate, the product comprising a non-tapered FinFET device formed in a first region of said substrate and a tapered FinFET device formed in a second region of said substrate, the method comprising:
forming a patterned fin-formation etch mask layer across said first and second regions of said substrate, said patterned fin-formation etch mask layer comprising a first plurality of features positioned above said first region and a second plurality of features positioned above said second region;
while masking said patterned fin-formation etch mask layer in said second region, performing an anisotropic etching process through said patterned fin-formation etch mask layer to form a first plurality of fins in said first region;
after forming said first plurality of fins, performing at least one etching process to:
remove a portion of at least one of said first plurality of features of said patterned fin-formation etch mask layer positioned above at least one of said first plurality of fins in said first region so as to thereby expose a portion of an upper surface of said at least one of said first plurality of fins in said first region; and
to remove at least a portion of at least one of said second plurality of features of said patterned fin-formation etch mask layer that are positioned above said second region;
after performing at least one etching process and while masking said patterned fin-formation etch mask layer in said first region, performing an anisotropic etching process through said patterned fin-formation etch mask layer to form a second plurality of fins in said second region; and
after forming said second plurality of fins, forming a masking layer that covers said patterned fin-formation etch mask layer in said second region and thereafter performing an isotropic etching process to remove at least a portion of at least one of said first plurality of fins in said first region having said exposed upper surface.

14. The method of claim 13, wherein performing said anisotropic etching process through said patterned fin-formation etch mask layer to form said second plurality of fins for said tapered FinFET device results in at least some of said second plurality of fins having cut edges.

15. The method of claim 14, wherein forming said masking layer that covers said patterned fin-formation etch mask layer comprises forming said masking layer that covers said patterned fin-formation etch mask layer and said cut edges of said at least some of said second plurality of fins.

16. The method of claim 1, further comprising replacing said removed portion of said at least said first fin with an insulating material.

17. The method of claim 1, wherein said portion of said at least said first fin of said initially formed first plurality of fins is removed after said second plurality of fins for said tapered FinFET device are formed in said second region.

18. The method of claim 1, wherein said portion of said at least said first fin of said initially formed first plurality of fins is removed before said second plurality of fins for said tapered FinFET device are formed in said second region.

19. The method of claim 1, wherein said second plurality of fins for said tapered FinFET device are formed in said second region after initially forming said first plurality of fins in said first region.

20. The method of claim 1, wherein said modified patterned fin-formation etch mask is formed above a semiconductor material layer comprising said semiconductor substrate, wherein performing said second etch process through said modified patterned fin-formation etch mask to define said second plurality of fins comprises etching a plurality of fin-formation trenches in said semiconductor material layer during said second etch process after initially forming said first plurality of fins, said plurality of fin-formation trenches defining said second plurality of fins for said tapered FinFET device.

\* \* \* \* \*